US012563718B2

(12) United States Patent
Han

(10) Patent No.:　US 12,563,718 B2
(45) Date of Patent:　　Feb. 24, 2026

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventor: Qinghua Han, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 334 days.

(21) Appl. No.: 18/450,509

(22) Filed: Aug. 16, 2023

(65) Prior Publication Data

US 2024/0098980 A1　Mar. 21, 2024

Related U.S. Application Data

(63) Continuation of application No. PCT/CN2023/098114, filed on Jun. 2, 2023.

(30) Foreign Application Priority Data

Sep. 21, 2022　(CN) .......................... 202211153790.8
Sep. 21, 2022　(CN) .......................... 202211153972.5
Sep. 21, 2022　(CN) .......................... 202211154217.9

(51) Int. Cl.
　　*H01B 12/00*　　　(2006.01)
　　*H10B 12/00*　　　(2023.01)

(52) U.S. Cl.
　　CPC ....... *H10B 12/395* (2023.02); *H10B 12/0383* (2023.02); *H10B 12/482* (2023.02); *H10B 12/50* (2023.02)

(58) Field of Classification Search
　　CPC .............. H10B 12/395; H10B 12/0383; H10B 12/482; H10B 12/50; H10B 12/05;
(Continued)

(56) References Cited

U.S. PATENT DOCUMENTS

| | | | |
|---|---|---|---|
| 12,431,385 B2 * | 9/2025 | Han ................. | H01L 21/76229 |
| 2014/0001527 A1 * | 1/2014 | Myung ................. | H10D 84/00 |
| | | | 257/296 |

(Continued)

FOREIGN PATENT DOCUMENTS

CN　　　114068548 A　　2/2022

OTHER PUBLICATIONS

European Patent Office, Extended European Search Report Issued in Application No. 23809952.7, Sep. 17, 2024, Germany, 9 pages.

*Primary Examiner* — Jarrett J Stark
(74) *Attorney, Agent, or Firm* — Kilpatrick Townsend & Stockton LLP

(57) ABSTRACT

A method for manufacturing a semiconductor structure and a semiconductor structure are provided. The manufacturing method includes the following operations. A substrate is provided, and a first groove and a second groove are formed in the substrate, each of the first groove and the second groove having a depth in a first direction. The first groove includes multiple first sub-grooves arranged in the first direction, the second groove includes multiple second sub-grooves arranged in the first direction, and sidewalls of the first sub-grooves and sidewalls of the second sub-grooves are convex outwards. Word lines protruding away from the first groove each are formed at an interface of adjacent first sub-grooves. First source-drain layers formed on the side-walls of the first sub-grooves, and second source-drain layers protruding away from the second groove each are formed at an interface of adjacent second sub-grooves.

17 Claims, 28 Drawing Sheets

(58) Field of Classification Search

CPC ...... H10B 12/00; H10B 12/03; H10B 12/488; H10B 12/315; H10B 12/30; H10B 12/34; H10B 12/02; H01L 21/76229; H10D 30/025

See application file for complete search history.

(56) References Cited

U.S. PATENT DOCUMENTS

| | | | |
|---|---|---|---|
| 2014/0024214 A1* | 1/2014 | Kim | H10B 12/482 |
| | | | 438/675 |
| 2014/0061850 A1* | 3/2014 | Cho | H01L 21/764 |
| | | | 257/506 |
| 2019/0123135 A1 | 4/2019 | Chang et al. | |
| 2022/0045094 A1* | 2/2022 | Lee | H10B 41/35 |
| 2022/0115378 A1 | 4/2022 | Lee et al. | |
| 2023/0013070 A1* | 1/2023 | Shao | H10B 12/315 |
| 2023/0014198 A1* | 1/2023 | Shao | H10B 12/395 |
| 2023/0274973 A1* | 8/2023 | Han | H10B 12/482 |
| | | | 257/773 |
| 2025/0081440 A1* | 3/2025 | Han | H10D 64/514 |
| 2025/0159898 A1* | 5/2025 | Baik | H10B 51/20 |

* cited by examiner

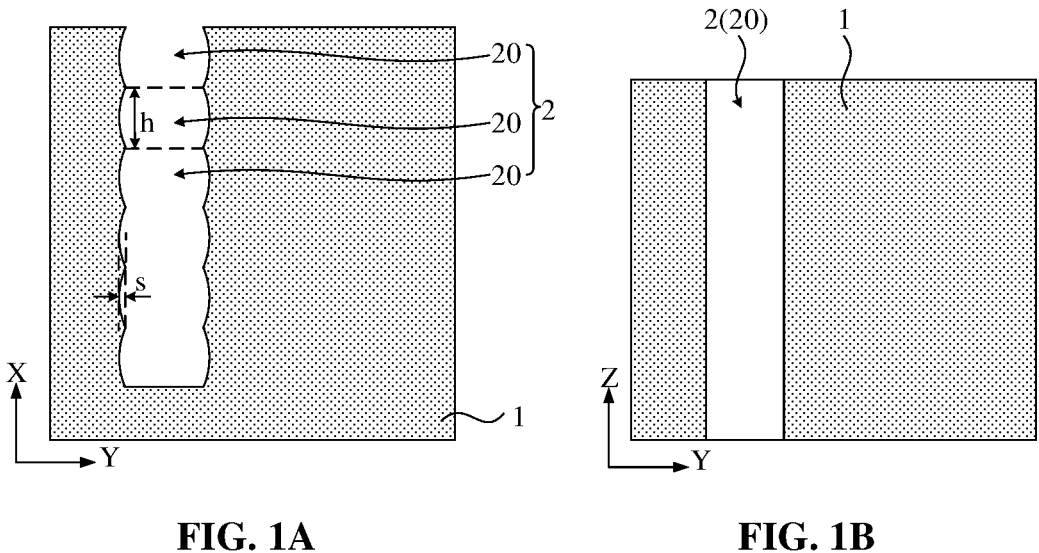
FIG. 1A                    FIG. 1B
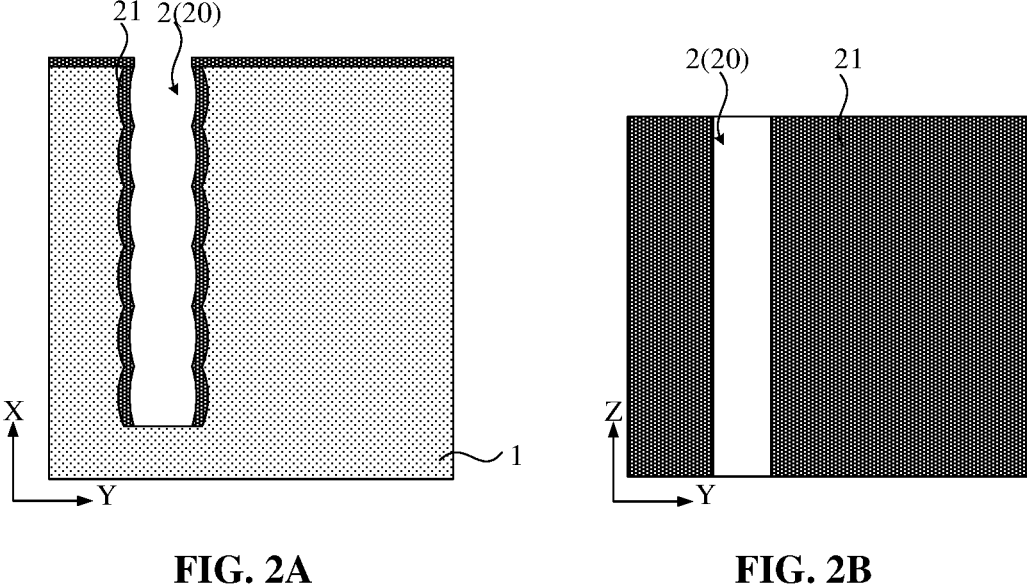
FIG. 2A                    FIG. 2B

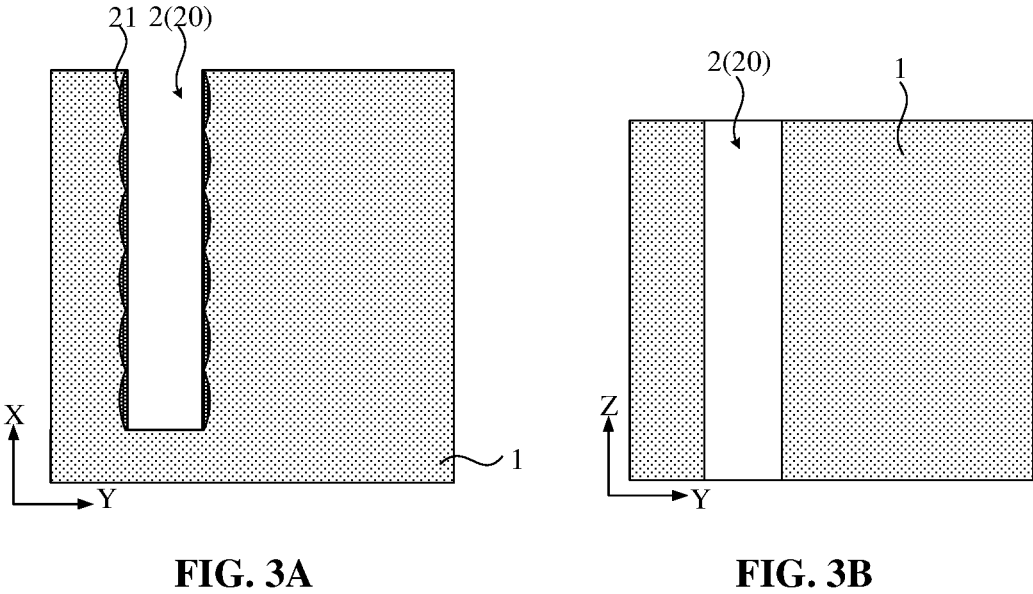
FIG. 3A                    FIG. 3B
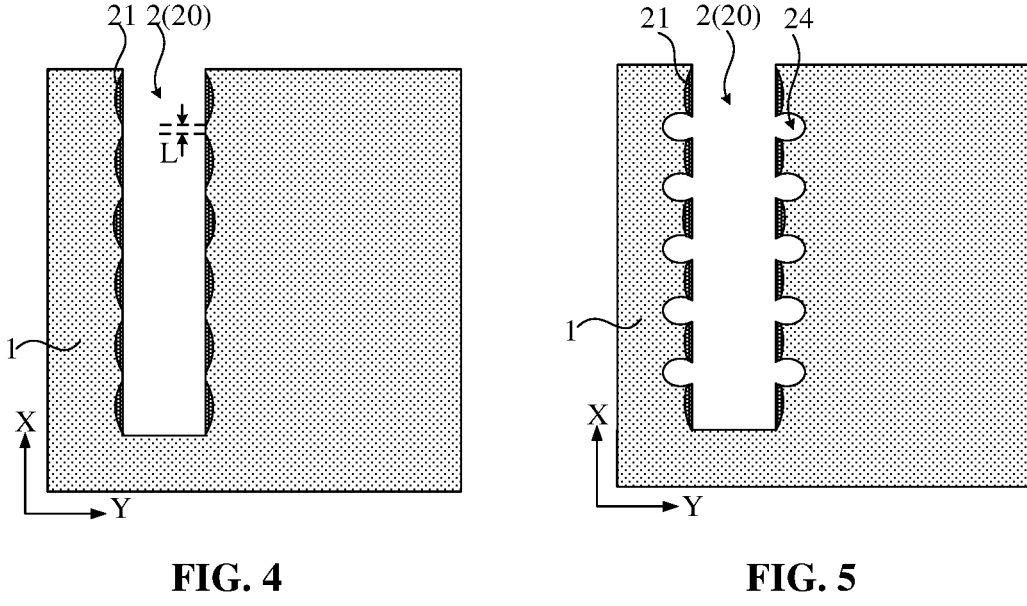
FIG. 4                     FIG. 5

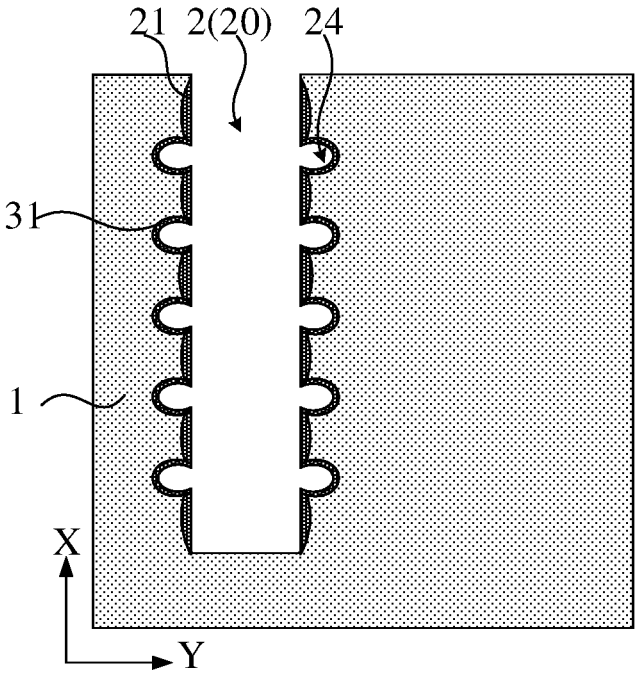
FIG. 6
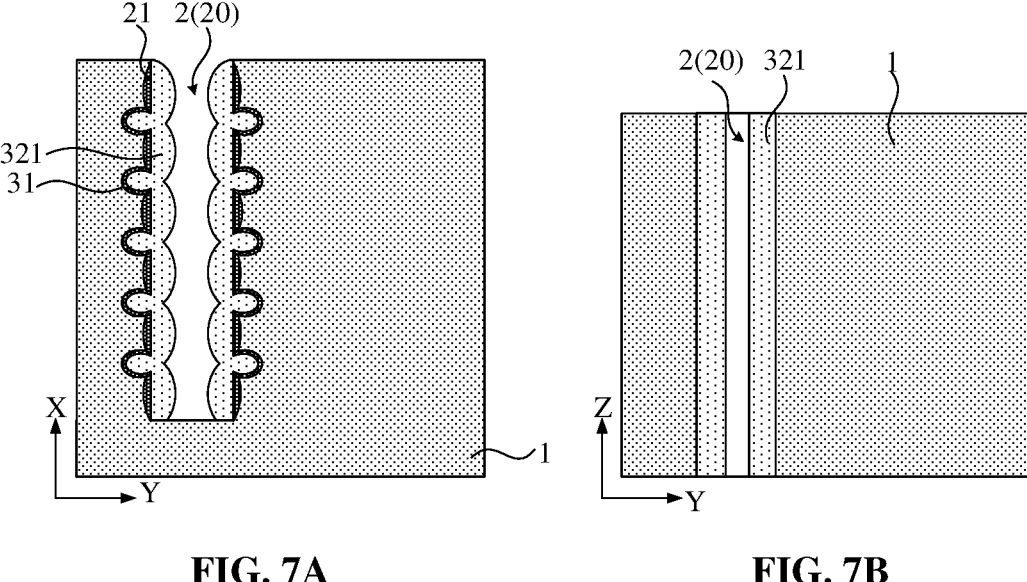
FIG. 7A                         FIG. 7B

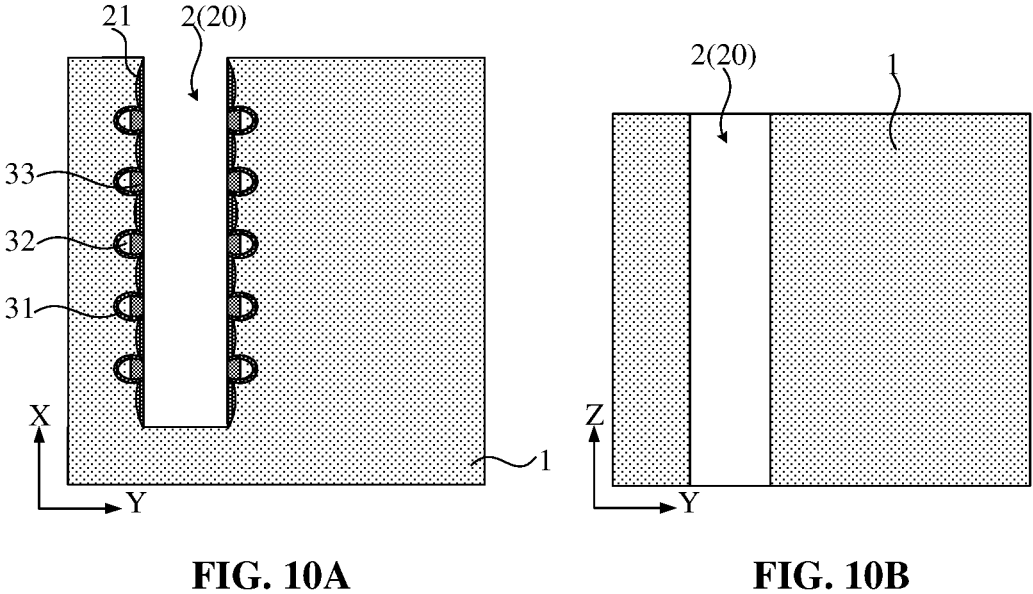
FIG. 10A
FIG. 10B
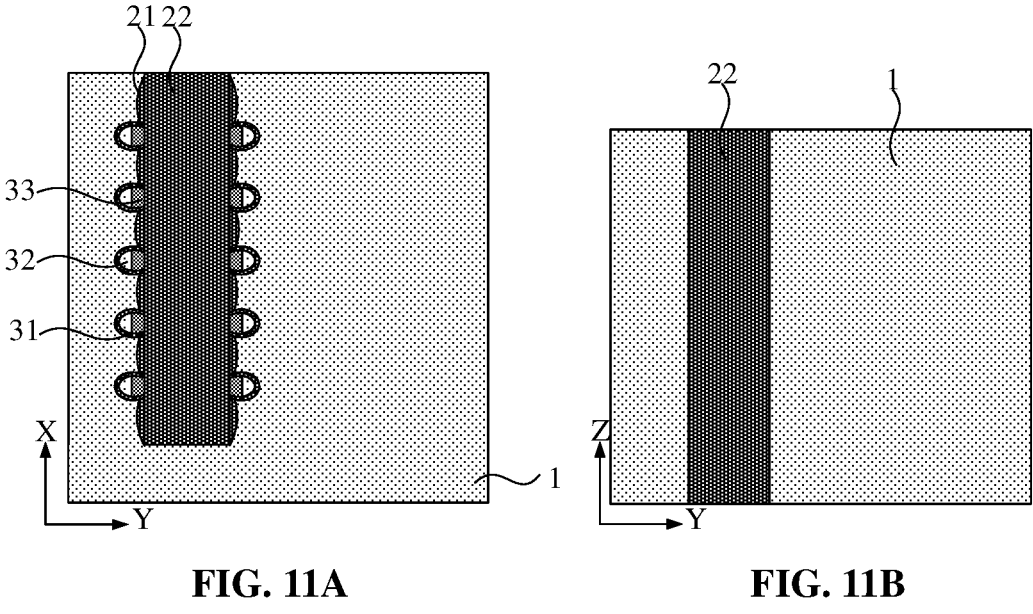
FIG. 11A
FIG. 11B

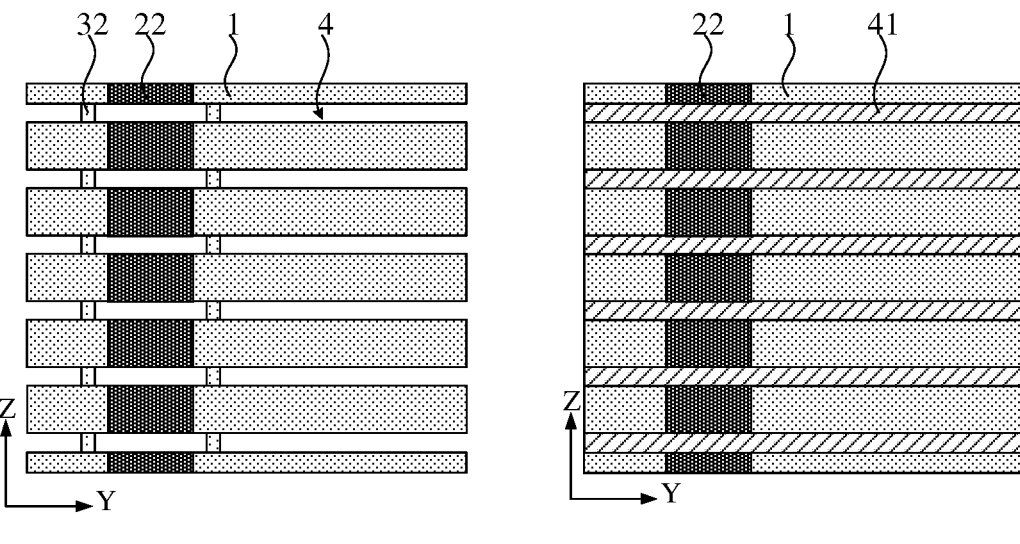
FIG. 12
FIG. 13
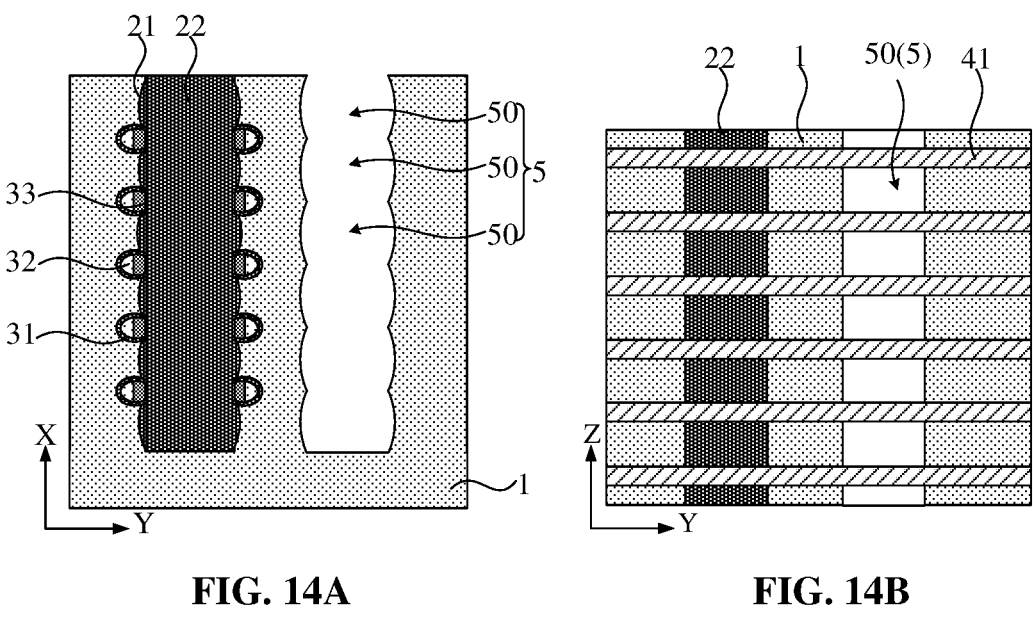
FIG. 14A
FIG. 14B

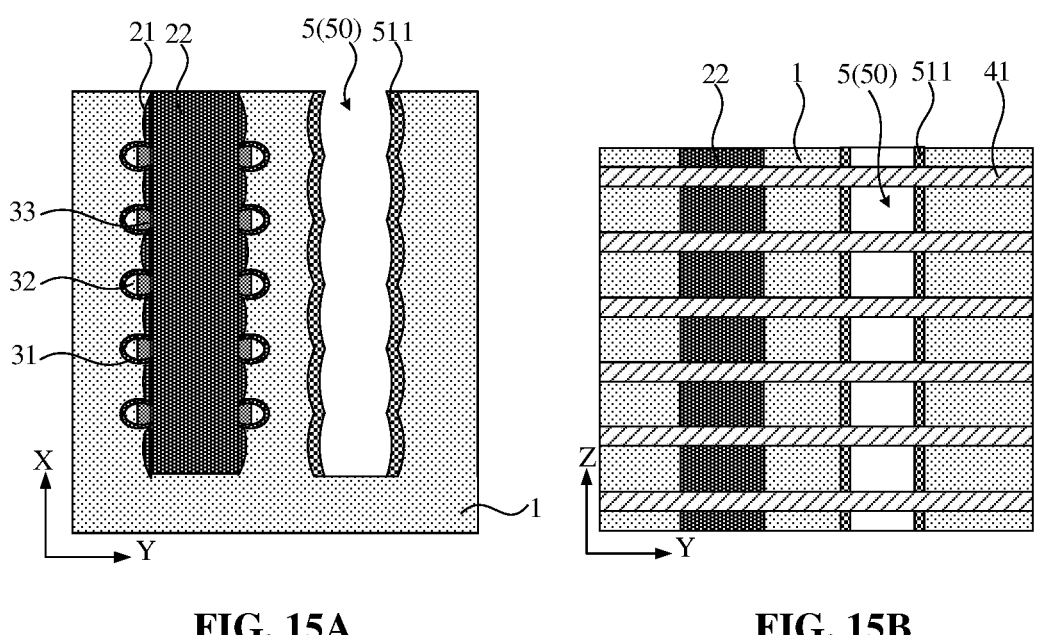
FIG. 15A                 FIG. 15B
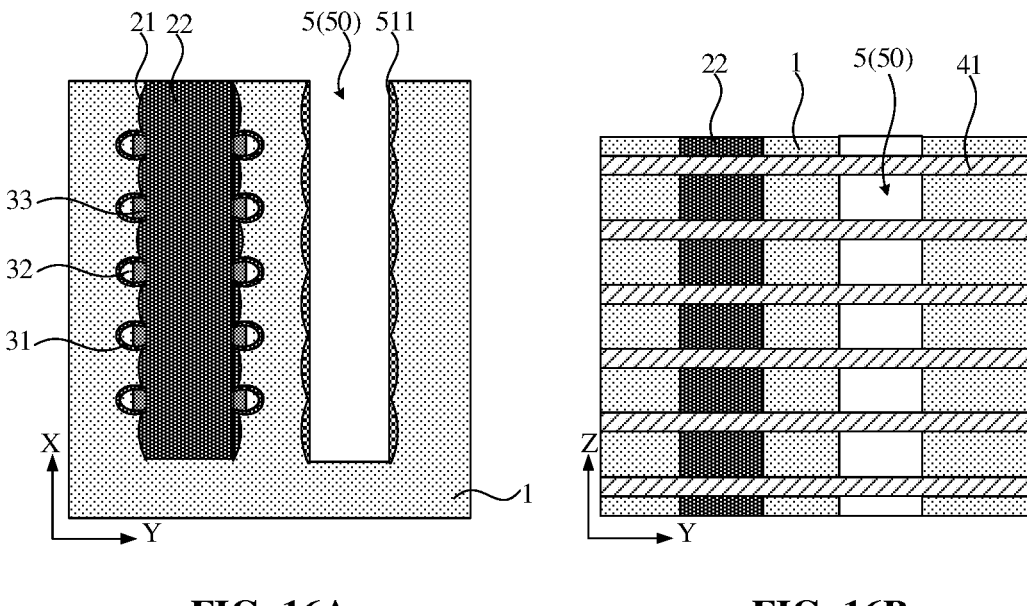
FIG. 16A                 FIG. 16B

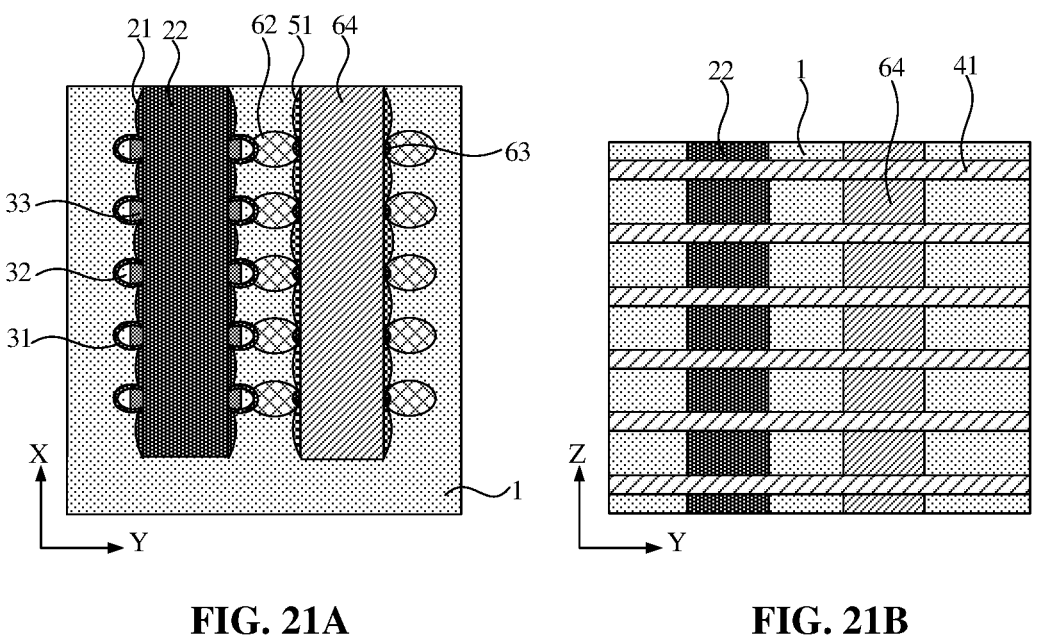
FIG. 21A                                    FIG. 21B
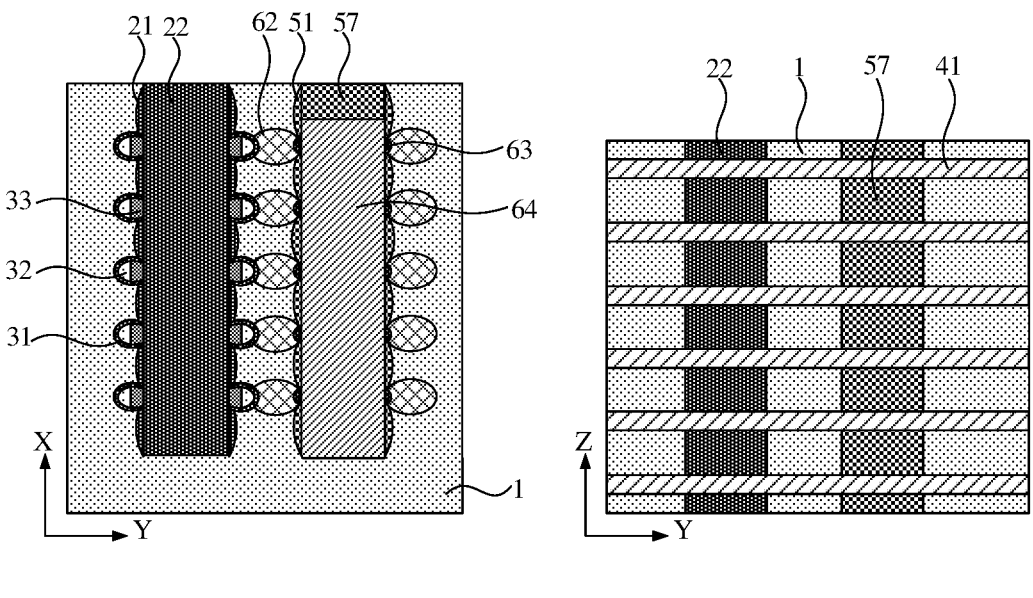
FIG. 22A                                    FIG. 22B

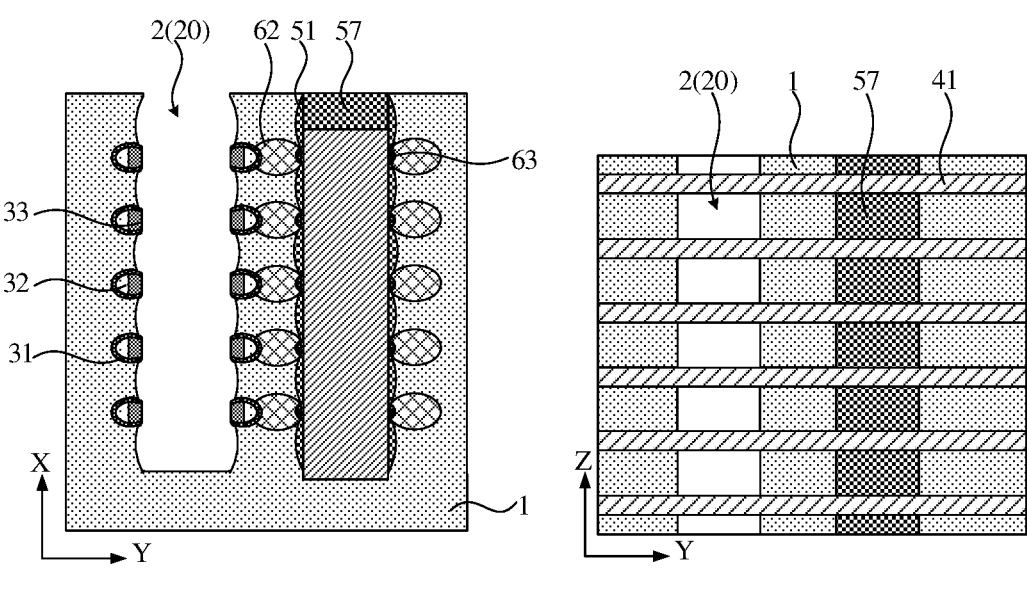
FIG. 23A                    FIG. 23B
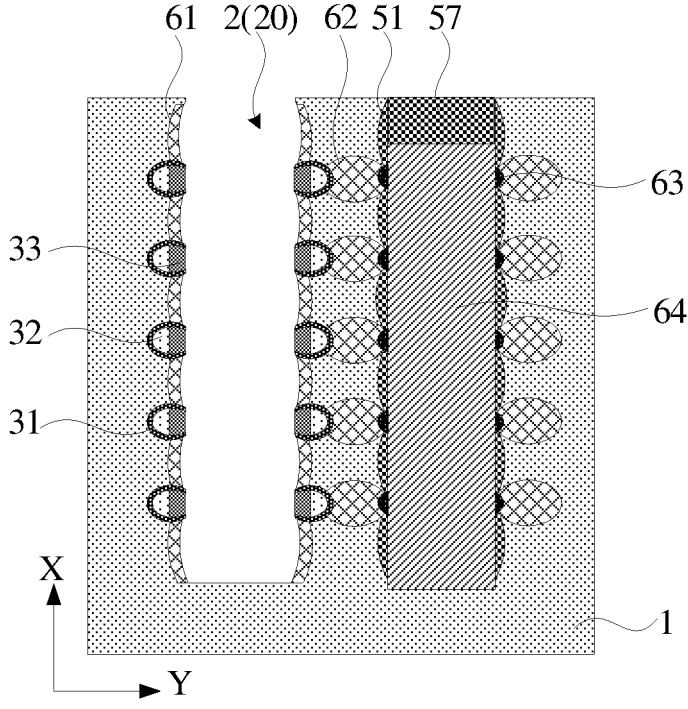
FIG. 24

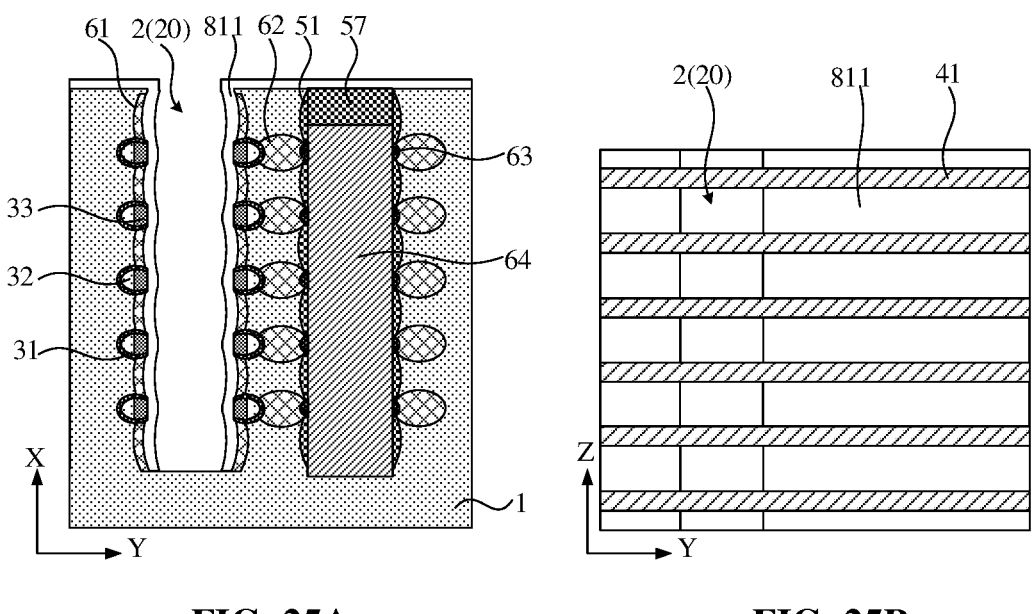
FIG. 25A            FIG. 25B
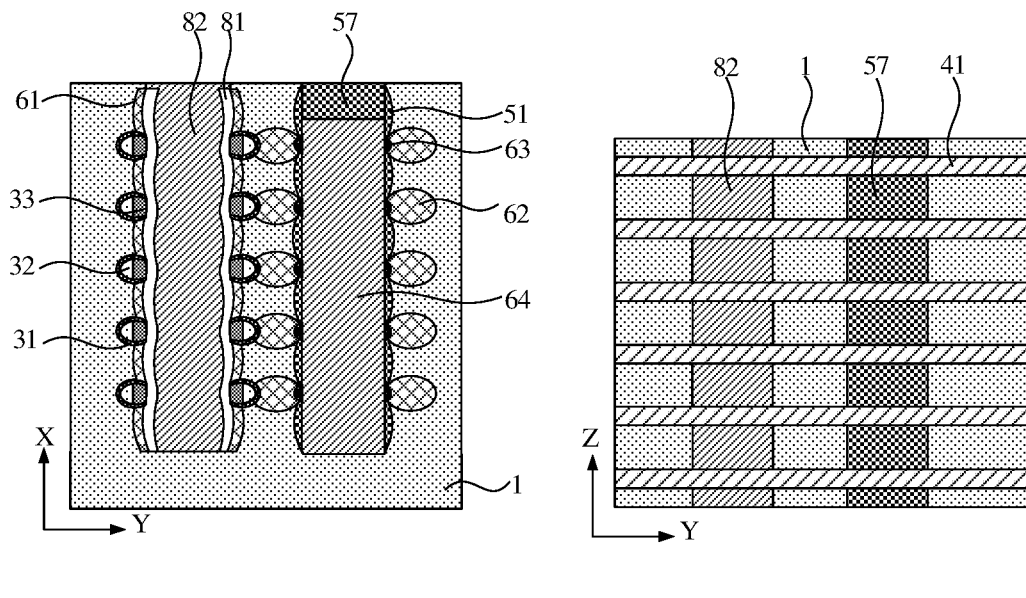
FIG. 26A            FIG. 26B

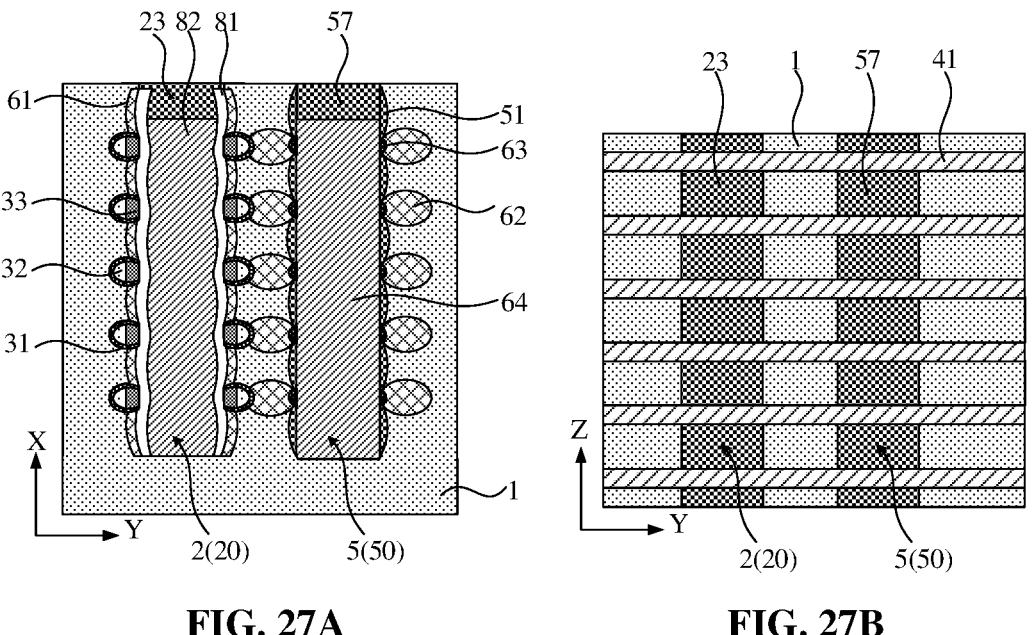
FIG. 27A                    FIG. 27B
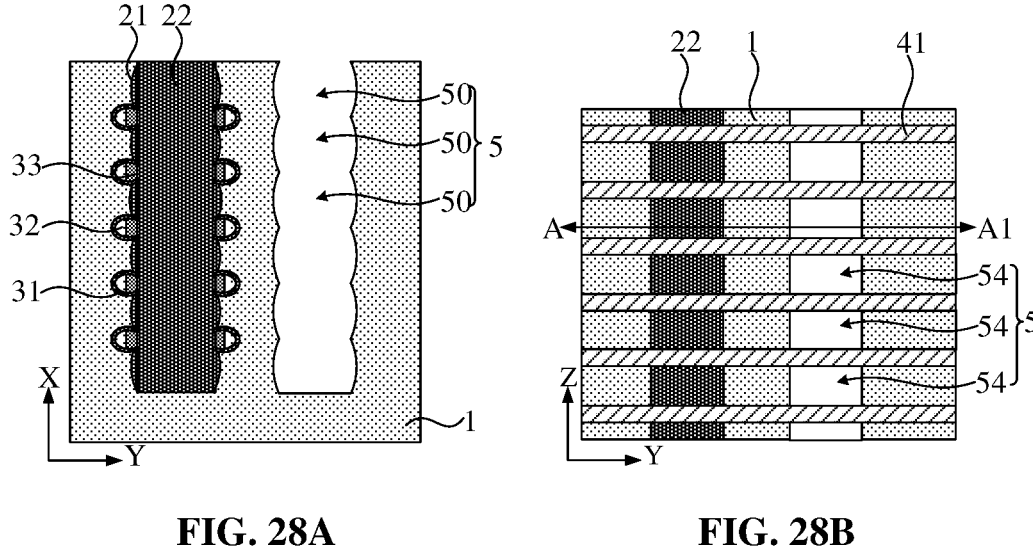
FIG. 28A                    FIG. 28B

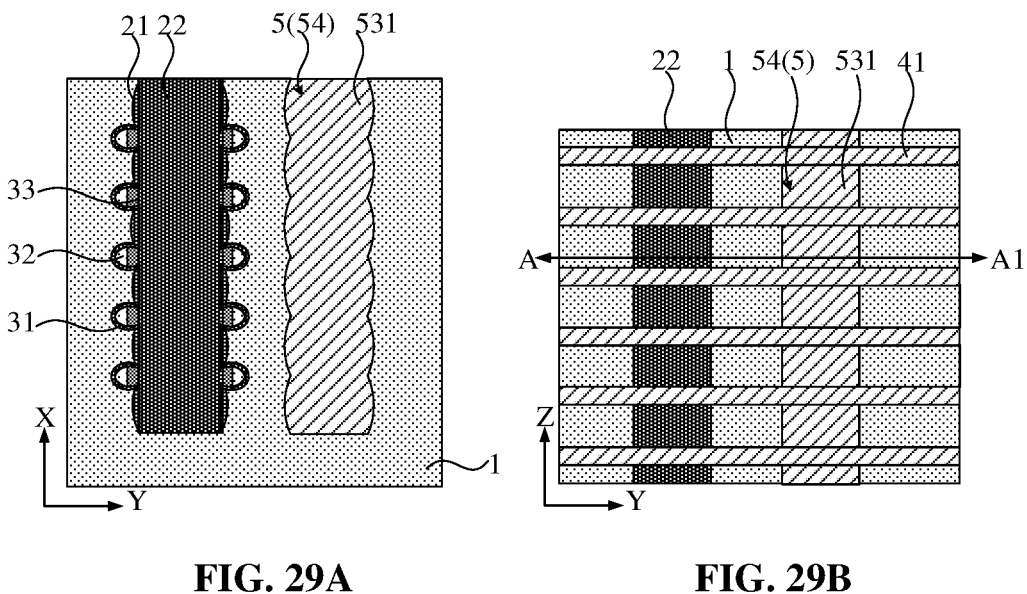
FIG. 29A                    FIG. 29B
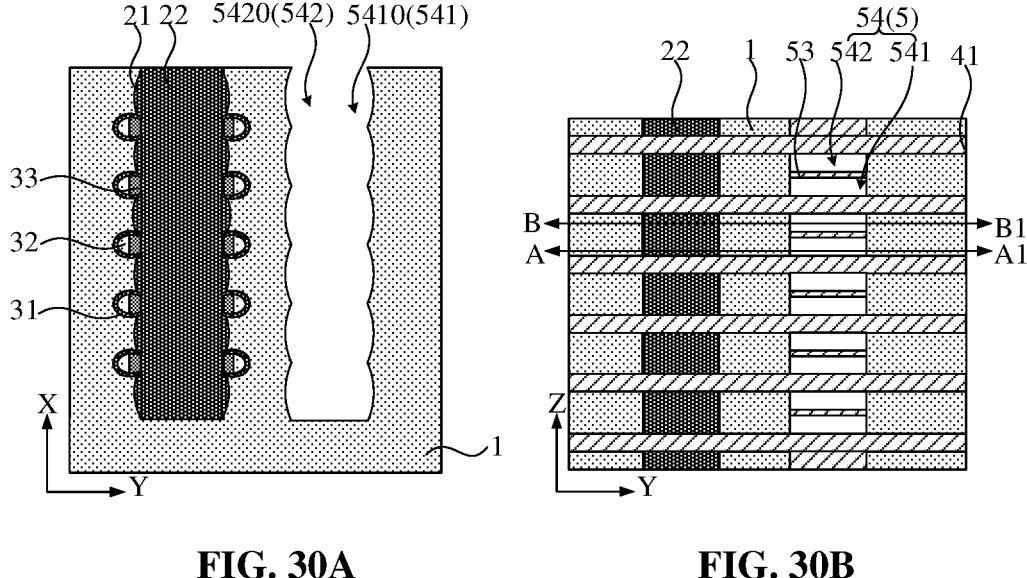
FIG. 30A                    FIG. 30B

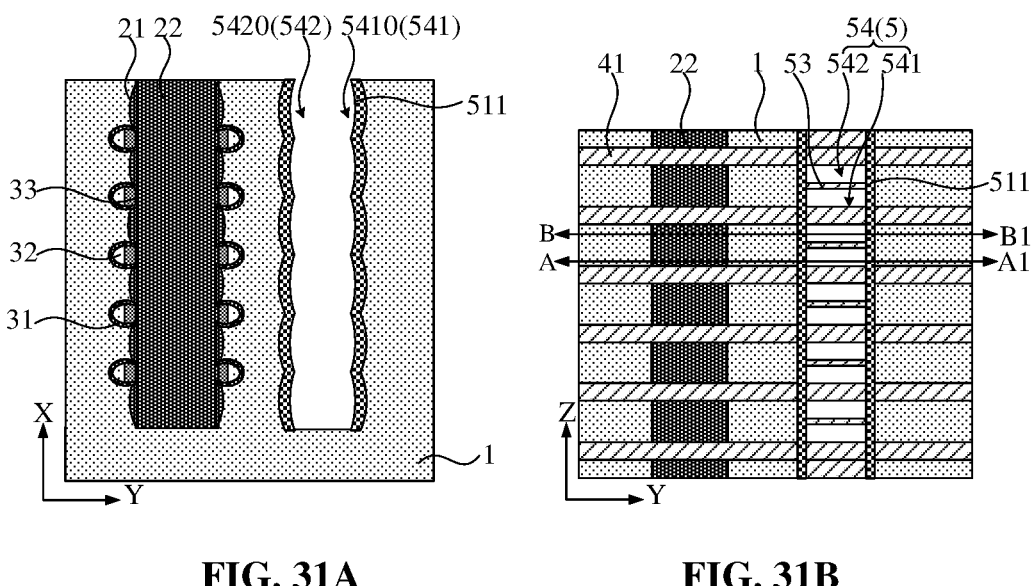
FIG. 31A                    FIG. 31B
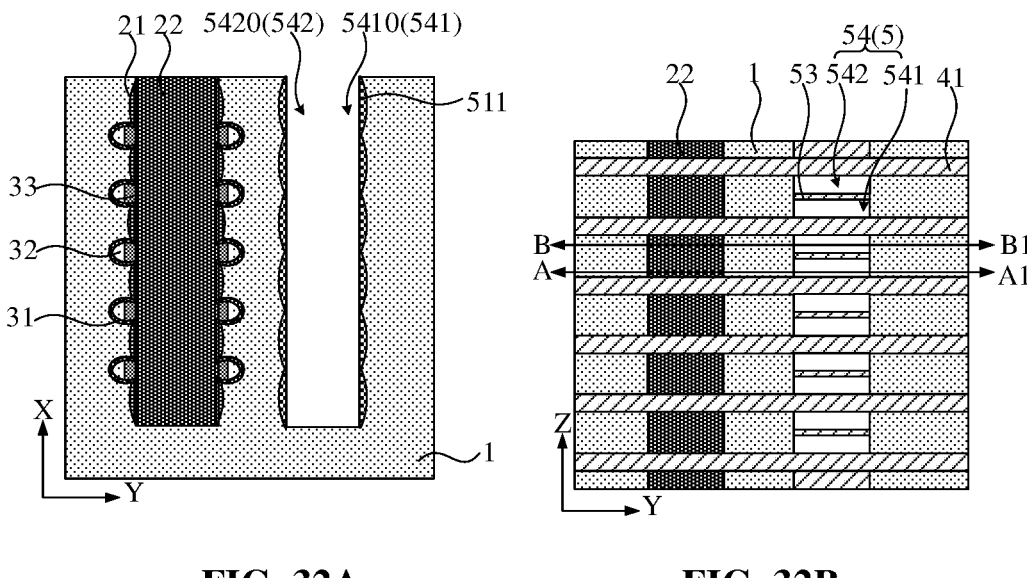
FIG. 32A                    FIG. 32B

FIG. 34A             FIG. 34B

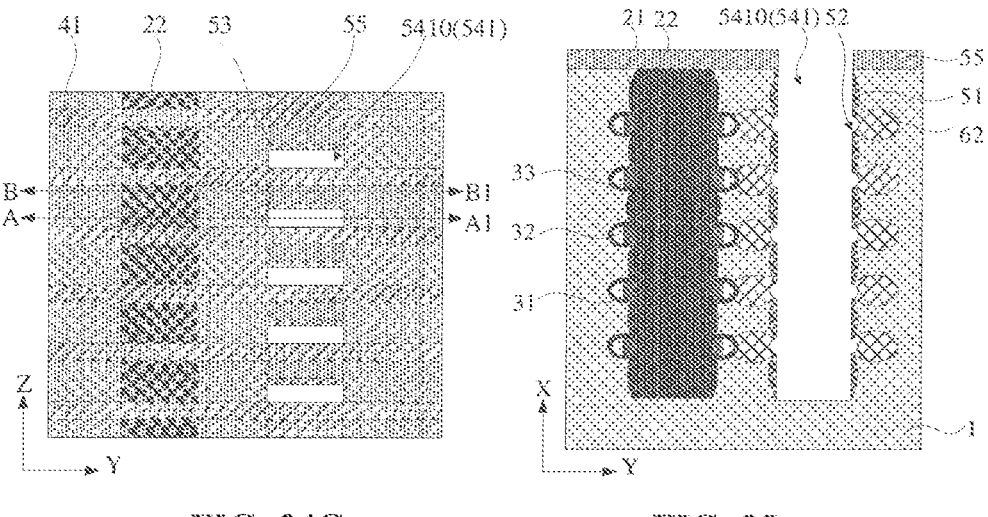
FIG. 34C                    FIG. 35
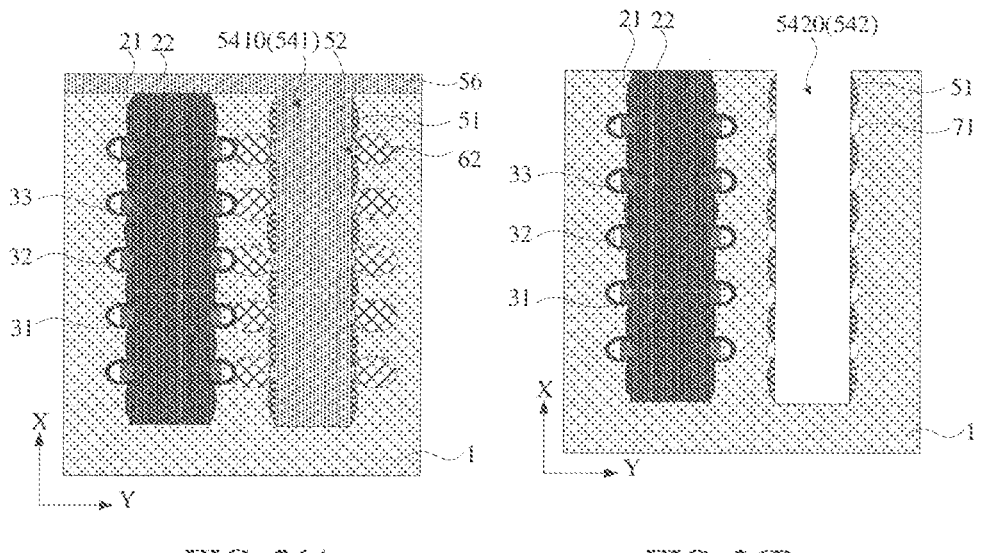
FIG. 36A                    FIG. 36B

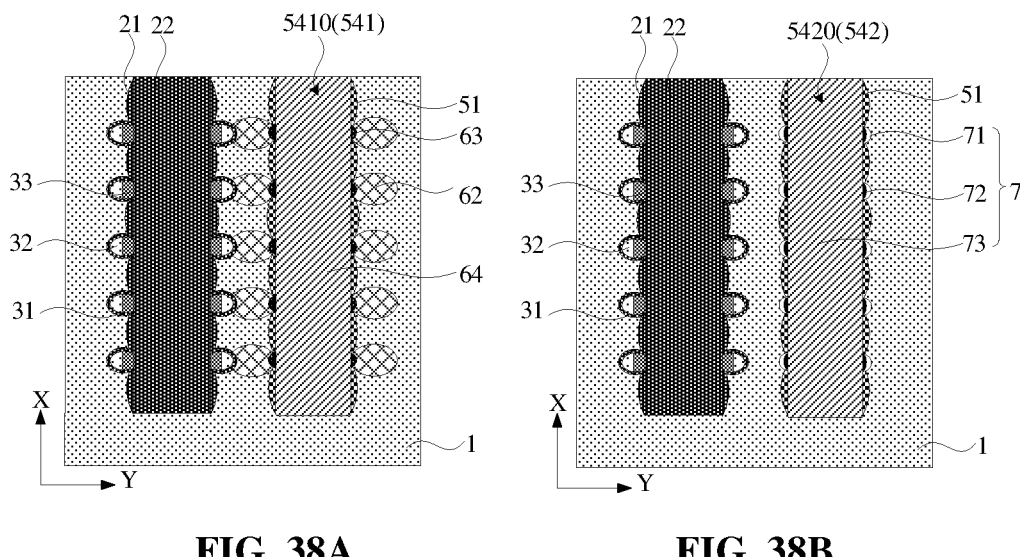
FIG. 38A                    FIG. 38B
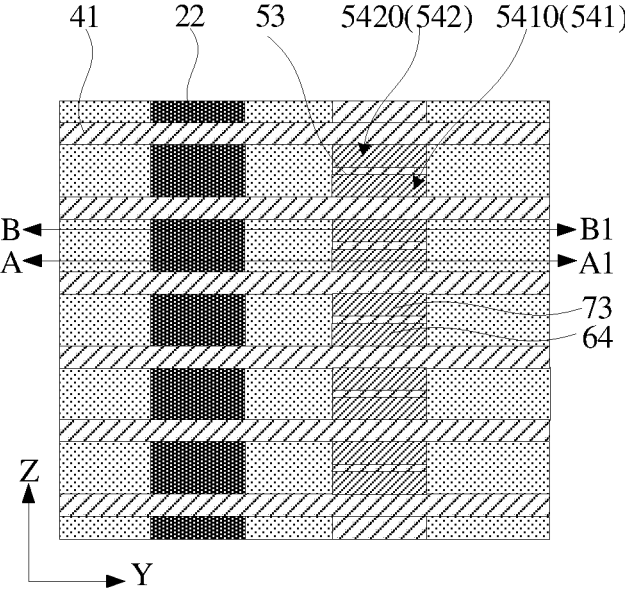
FIG. 38C

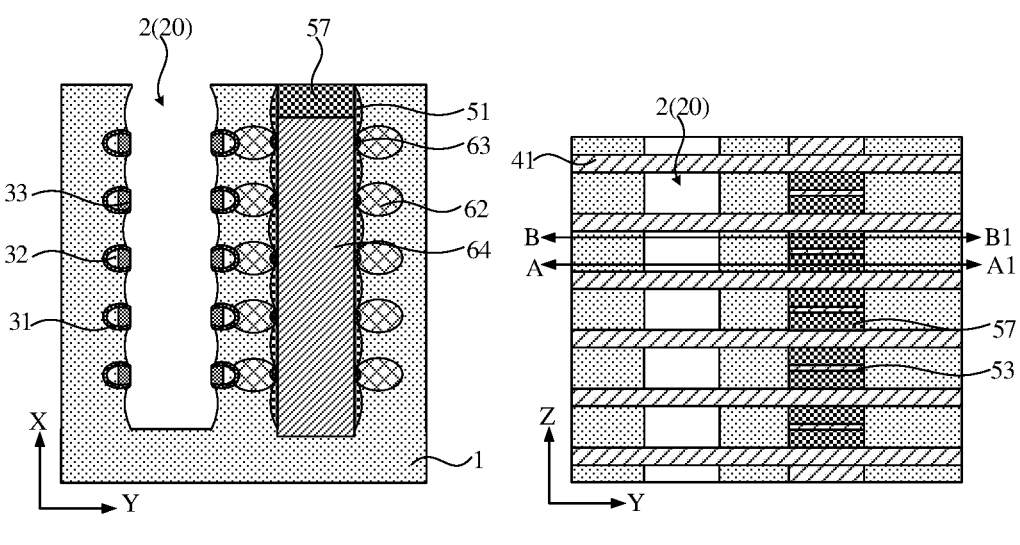
FIG. 40A                    FIG. 40B
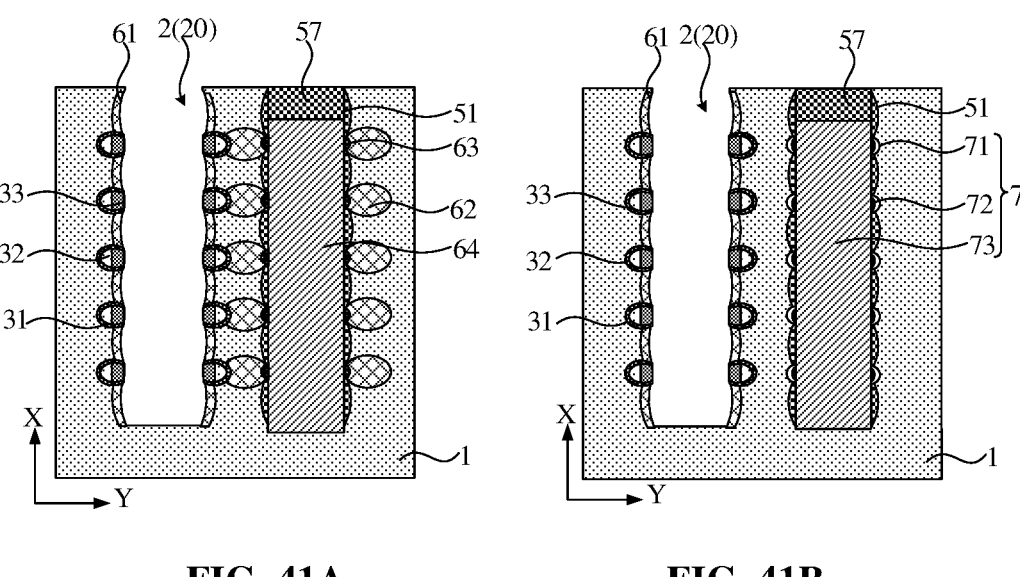
FIG. 41A                    FIG. 41B

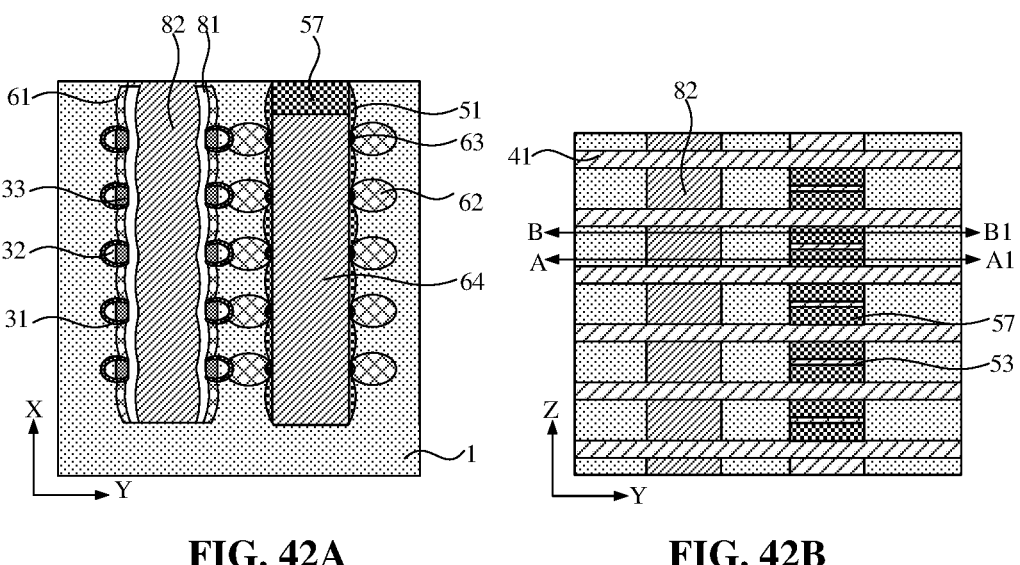
FIG. 42A          FIG. 42B
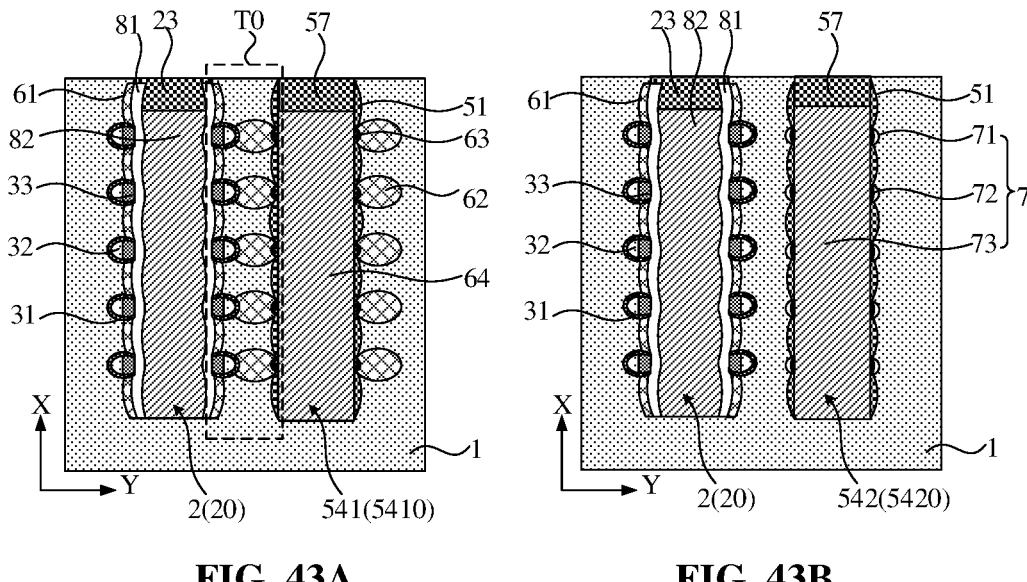
FIG. 43A          FIG. 43B

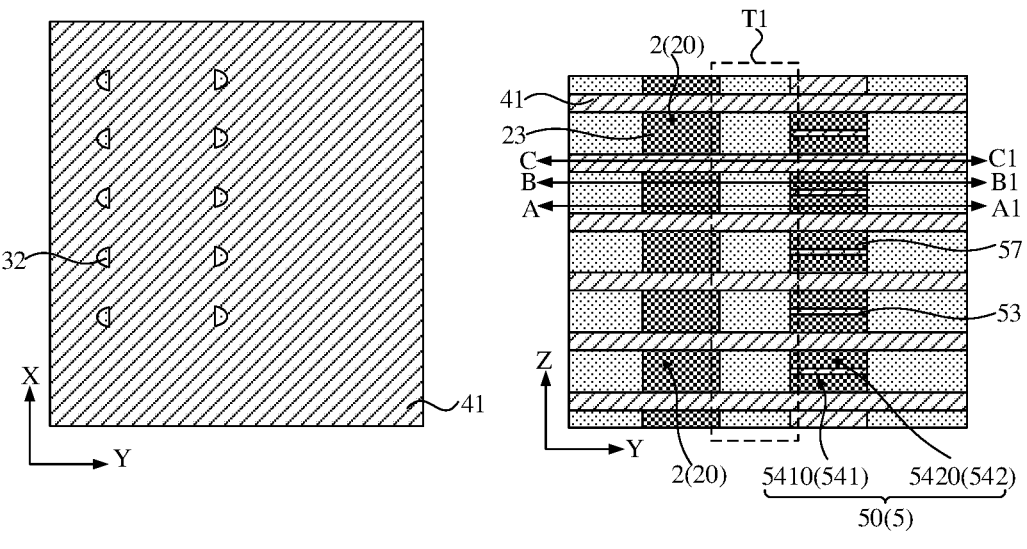
FIG. 43C                    FIG. 43D
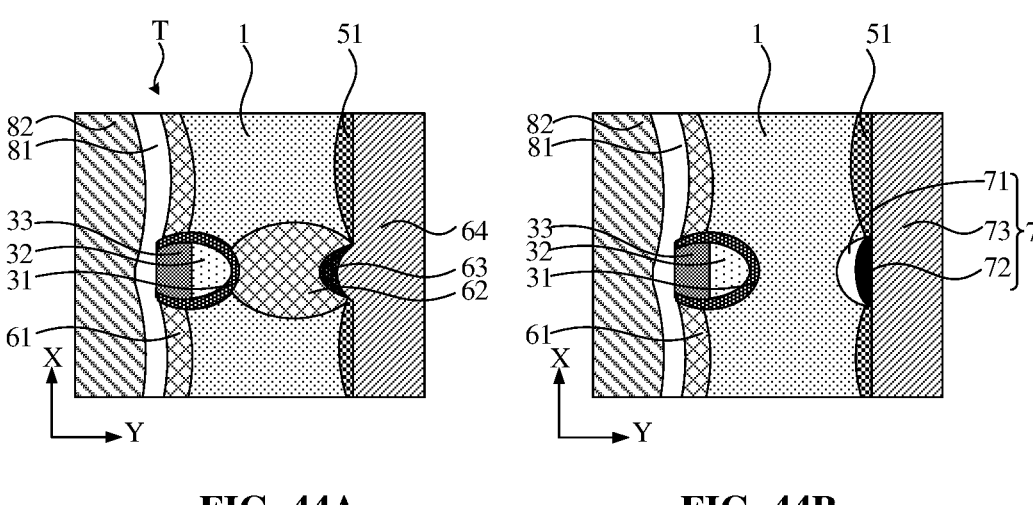
FIG. 44A                    FIG. 44B

SEMICONDUCTOR STRUCTURE AND METHOD FOR MANUFACTURING SAME

CROSS-REFERENCE TO RELATED APPLICATIONS

This is a continuation application of International Patent Application No. PCT/CN2023/098114, filed on Jun. 2, 2023, which claims priority to Chinese Patent Application No. 202211153790.8, filed on Sep. 21, 2022, to Chinese Patent application No. 202211154217.9, filed on Sep. 21, 2022, and to Chinese Patent application No. 202211153972.5, filed on Sep. 21, 2022. The disclosures of International Patent Application No. PCT/CN2023/098114, Chinese Patent Application No. 202211153790.8, Chinese Patent application No. 202211154217.9, and Chinese Patent application No. 202211153972.5 are hereby incorporated by reference in their entireties.

BACKGROUND

Dynamic Random Access Memory (DRAM) is a semiconductor memory, of which a main functional principle is to use an amount of charges stored in a capacitor to represent whether a binary bit stored in the memory is 1 or 0.

A three-dimensional (3D) DRAM is a structure where multiple layers of memory cells are stacked, and has higher integration and larger capacity per unit area, which is beneficial to reducing cost per unit area. However, performance of the 3D DRAM still needs to be improved.

SUMMARY

Embodiments of the disclosure relates to the field of semiconductors, and in particular to a method for manufacturing a semiconductor structure and a semiconductor structure.

Embodiments of the disclosure provide a semiconductor structure and a method for manufacturing the same, which is at least beneficial to improving performance of the semiconductor structure.

According to some embodiments of the disclosure, an aspect of the embodiments of the disclosure provides a method for manufacturing a semiconductor structure. The method for manufacturing a semiconductor structure includes the following operations. A substrate is provided, and a first groove and a second groove are formed in the substrate, each of the first groove and the second groove having a depth in a first direction, the first groove including multiple first sub-grooves arranged in the first direction, the second groove including multiple second sub-grooves arranged in the first direction, and sidewalls of the first sub-grooves and sidewalls of the second sub-grooves being convex outwards; word lines protruding away from the first groove each are formed at an interface of adjacent first sub-grooves of the first sub-grooves; first source-drain layers are formed on the sidewalls of the first sub-grooves; and second source-drain layers protruding away from the second groove each are formed at an interface of adjacent second sub-grooves of the second sub-grooves; each of the second source-drain layers being located between the first groove and the second groove, each of the word lines being located between the first groove and the second groove, and each of the second source-drain layers being arranged opposite to a respective one of the word lines.

According to some embodiments of the disclosure, another aspect of the embodiments of the disclosure further provides a semiconductor structure. The semiconductor structure includes a substrate, word lines, first source-drain layers and second source-drain layers. A first groove and a second groove are provided in the substrate, each of the first groove and the second groove has a depth in a first direction, the first groove includes multiple first sub-grooves arranged in the first direction, the second groove includes multiple second sub-grooves arranged in the first direction, and sidewalls of the first sub-grooves and sidewalls of the second sub-grooves are convex outwards. The word lines protrude away from the first groove and each are arranged at an interface of adjacent first sub-grooves of the first sub-grooves. The first source-drain layers are arranged on the sidewalls of the first sub-grooves. The second source-drain layers protrude away from the second groove and each are arranged at an interface of adjacent second sub-grooves of the second sub-grooves. Each of the second source-drain layers is located between the first groove and the second groove, each of the word lines is located between the first groove and the second groove, and each of the second source-drain layers is arranged opposite to a respective one of the word lines.

BRIEF DESCRIPTION OF THE DRAWINGS

Here, the drawings are incorporated into the description and constitute a part of the description, show embodiments complying with the disclosure, and are used to explain principles of the disclosure together with the description. It is apparent that the drawings in the following descriptions are only some embodiments of the disclosure, and those of ordinary skill in the art may also assume other drawings according to these drawings without paying any creative work.

FIG. 1A, FIG. 1B, FIG. 2A, FIG. 2B, FIG. 3A, FIG. 3B, FIG. 4, FIG. 5, FIG. 6, FIG. 7A, FIG. 7B, FIG. 8A, FIG. 8B, FIG. 9A, FIG. 9B, FIG. 10A, FIG. 10B, FIG. 11A, FIG. 11B, FIG. 12, FIG. 13, FIG. 14A, FIG. 14B, FIG. 15A, FIG. 15B, FIG. 16A, FIG. 16B, FIG. 17, FIG. 18, FIG. 19, FIG. 20, FIG. 21A, FIG. 21B, FIG. 22A, FIG. 22B, FIG. 23A, FIG. 23B, FIG. 24, FIG. 25A, FIG. 25B, FIG. 26A, FIG. 26B, FIG. 27A, and FIG. 27B show different schematic structural diagrams corresponding to operations of a method for manufacturing a semiconductor structure according to an embodiment of the disclosure respectively.

FIG. 28A, FIG. 28B, FIG. 29A, FIG. 29B, FIG. 30A, FIG. 30B, FIG. 31A, FIG. 31B, FIG. 32A, FIG. 32B, FIG. 33, FIG. 34A, FIG. 34B, FIG. 34C, FIG. 35, FIG. 36A, FIG. 36B, FIG. 36C, FIG. 37A, FIG. 37B, FIG. 37C, FIG. 38A, FIG. 38B, FIG. 38C, FIG. 39A, FIG. 39B, FIG. 39C, FIG. 40A, FIG. 40B, FIG. 41A, FIG. 41B, FIG. 42A, FIG. 42B, FIG. 43A, FIG. 43B, FIG. 43C, and FIG. 43D show different schematic structural diagrams corresponding to operations of a method for manufacturing a semiconductor structure according to another embodiment of the disclosure respectively.

FIG. 44A is a partially enlarged view of FIG. 43A.
FIG. 44B is a partially enlarged view of FIG. 43B.

DETAILED DESCRIPTION

Figures 8A, 8B:
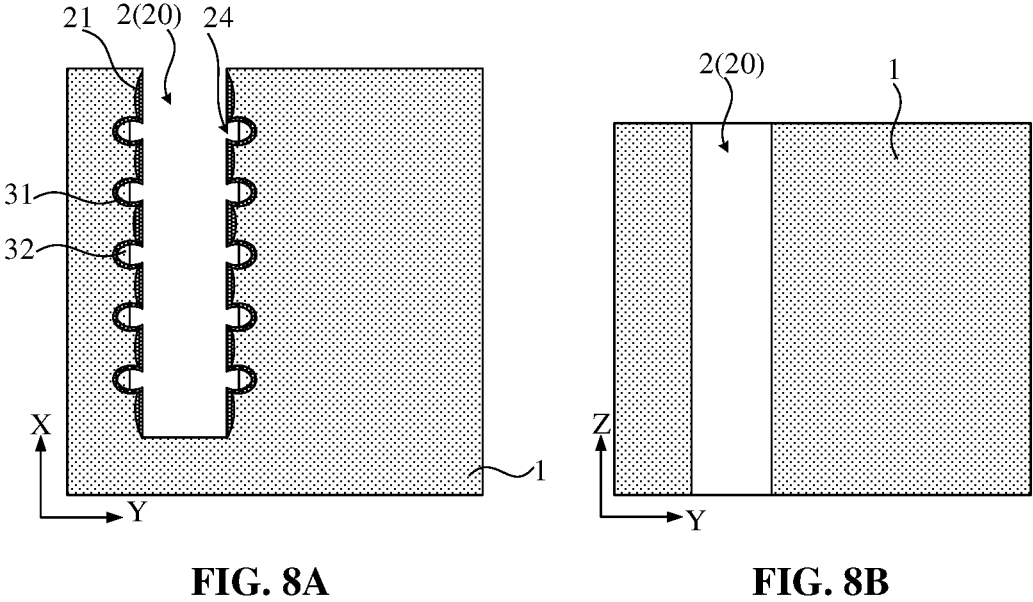

It may be known from the background that performance of a three-dimensional (3D) Dynamic Random Access Memory (DRAM) still needs to be improved. It is found through analysis that main reasons for this are as follows. There are mainly two kinds of 3D DRAMs. The first kind of 3D DRAM is based on Indium Gallium Zinc Oxide (IGZO) material to form 3D DRAM with a vertical annular Channel-All-Around (CAA) structure. However, it is difficult to control uniformity of the IGZO material and the IGZO material has many defects. The second kind of 3D DRAM is based on a superlattice technology to form a structure composed of alternate layers of different materials, that is, form alternate layers of silicon and germanium silicon. However, depositing multiple layers of silicon and germanium silicon will cause more interface defects.

An embodiment of the disclosure provides a method for manufacturing a semiconductor structure, including the following operations. A first groove and a second groove are formed in a substrate, the first groove including multiple first sub-grooves, the second groove including multiple second sub-grooves, and sidewalls of the first sub-grooves and sidewalls of the second sub-grooves being convex outwards. Word lines (WLs) protruding away from the first groove each are formed at an interface of adjacent first sub-grooves of the first sub-grooves. First source-drain layers are formed on the sidewalls of the first sub-grooves. Second source-drain layers protruding away from the second groove each are formed at an interface of adjacent second sub-grooves of the second sub-grooves. That is, transistors are formed in the substrate based on wavy sidewalls of the first and second grooves, thereby avoiding usage of IGZO material and superlattice technology to form transistors, to reduce defects of the semiconductor structure and improve performance of the semiconductor structure.

In particular, A method for manufacturing a semiconductor structure of the disclosure includes: providing a substrate, and forming a first groove and a second groove in the substrate, each of the first groove and the second groove having a depth in a first direction, in which the first groove includes a plurality of first sub-grooves arranged in the first direction, the second groove includes a plurality of second sub-grooves arranged in the first direction, and sidewalls of the first sub-grooves and sidewalls of the second sub-grooves are convex towards; forming word lines each located at an interface of adjacent first sub-grooves of the first sub-grooves and protruding away from the first groove; forming first source-drain layers on the sidewalls of the first sub-grooves; and forming second source-drain layers protruding away from the second groove and each located at an interface of adjacent second sub-grooves of the second sub-grooves, each of the second source-drain layers being located between the first groove and the second groove, each of the word lines being located between the first groove and the second groove, and each of the second source-drain layers being arranged opposite to a respective one of the word lines.

In an example, the method for manufacturing further includes before forming the word lines: forming holes each located at the interface of adjacent first sub-grooves of the first sub-grooves and protruding away from the first groove; and forming gate dielectric layers on inner walls of the holes, each of the gate dielectric layers covering a respective one of the word lines and being in contact with a respective one of the first source-drain layers and a respective one of the second source-drain layers.

In an example, forming the holes includes forming a first isolation film on a sidewall of the first groove, in which the first isolation film located at the interface of any adjacent first sub-grooves of the first sub-grooves being arranged to protrude towards interiors of the first sub-grooves; removing the first isolation film located at the interface of the any adjacent first sub-grooves, to expose the substrate located at the interface of the any adjacent first sub-grooves; and etching the substrate exposed from the first isolation film, to form the holes.

In an example, removing the first isolation film located at the interface of the any adjacent first sub-grooves, to expose the substrate located at the interface of the any adjacent first sub-grooves includes: etching along the first direction a part of the first isolation film located at the interface of the any adjacent first sub-grooves with the substrate itself as a mask; and removing the rest of the first isolation film located at the interface of the any adjacent first sub-grooves by an isotropic etching process, to expose the substrate located at the interface of the any adjacent first sub-grooves.

In an example, the method for manufacturing a semiconductor structure further includes: forming insulation layers in the holes, in which each of the insulation layers is located on a side of a respective one of the word lines facing the first groove; and each of the gate dielectric layers covers a surface of a respective one of the insulation layers.

In an example, forming the word lines includes: forming an initial word line on a sidewall of the first groove and in the holes; and removing the initial word line located on the sidewall of the first groove and a part of the initial word line in each of the holes by an isotropic etching process, wherein the initial word line remained in the holes forms the word lines.

In an example, the method for manufacturing includes forming a plurality of bit lines filling the second groove and each extending in the first direction, and each of the bit lines is electrically connected to the second source-drain layers.

In an example, the first groove and the second groove are arranged in a second direction and each extend in a third direction, the second direction is perpendicular to the third direction, and each of the second direction and the third direction is perpendicular to the first direction, the word lines each extend in the third direction. the method for manufacturing further includes: forming a plurality of first isolation structures arranged at intervals. The plurality of first isolation structures extend in the second direction and are arranged in the third direction; each of the first isolation structures spans the first groove and the second groove, and the first isolation structures clap the word lines; there is a respective one of the first isolation structures between the first source-drain layers adjacent to each other in the third direction; there is a respective one of the first isolation structures between the second source-drain layers adjacent to each other in the third direction; and there is a respective one of the first isolation structures between adjacent bit lines of the bit lines arranged in the third direction.

In an example, the second groove between adjacent first isolation structures of the first isolation structures is in a continuous state, opposite sides of each of the bit lines in the third direction are in contact with respective isolation structures of the first isolation structures, and opposite sides of each of the second source-drain layers in the third direction are in contact with respective isolation structures of the first isolation structures.

In an example, forming the second source-drain layers includes: forming an initial second isolation film on a sidewall of the second groove, wherein the initial second isolation film located at the interface of any adjacent second sub-grooves of the second sub-grooves protrudes towards interiors of the second sub-grooves; removing the initial second isolation film located at the interface of the any adjacent second sub-grooves, to expose the substrate located at the interface of the any adjacent second sub-grooves, wherein the rest of the initial second isolation film forms a second isolation film; and doping the substrate exposed from the second isolation film, to form at least the second source-drain layers.

In an example, the second groove includes bit line grooves and electrode grooves spaced from each other in the third direction, each of the bit line grooves includes a plurality of sub-bit line grooves arranged in the first direction, each of the electrode grooves includes a plurality of sub-electrode grooves arranged in the first direction, sidewalls of the sub-bit line grooves and sidewalls of the sub-electrode grooves are convex outwards, and the second sub-groove includes the sub-bit line groove and the sub-electrode groove. The method includes: forming an electrode layer in each of the electrode grooves, the electrode layer being electrically connected to the substrate, forming the second source-drain layers protruding away from the second groove each located at an interface of adjacent sub-bit line grooves of the sub-bit line grooves, and forming the bit lines in the bit line grooves.

In an example, forming the electrode layer includes: heavily doping at least the substrate located at an interface of adjacent sub-electrode grooves of the sub-electrode grooves, to form a heavily doped layer; and forming a conductive layer filling a respective one of the electrode grooves and electrically connected to the heavily doped layer, the electrode layer including the conductive layer and the heavily doped layer.

In an example, the method further includes before forming the electrode layer and the second source-drain layers: forming a second isolation film located on the sidewalls of the sub-bit line grooves and the sidewalls of the sub-electrode grooves, the substrate located at the interface of any adjacent sub-bit line grooves of the sub-bit line grooves and the substrate located at an interface of any adjacent sub-electrode grooves of the sub-electrode grooves being exposed from the second isolation film; and doping the substrate located at the interface of the any adjacent sub-bit line grooves of the sub-bit line grooves after forming the second isolation film, to form the second source-drain layers.

In an example, wherein a doping depth of the heavily doped layer is less than a doping depth of each of the second source-drain layers.

In an example, the method further includes: forming a first metal silicide layer between the conductive layer and the heavily doped layer, the electrode layer including the first metal silicide layer, the conductive layer and the heavily doped layer.

In an example, forming the first groove, the bit line grooves and the electrode grooves includes: forming the first groove and the second groove by a Bosch process; spanning, by the first isolation structures, the first groove and the second groove, the first isolation structures dividing the second groove into a plurality of bit line electrode grooves arranged at intervals; and forming second isolation structures extending in the second direction, the second isolation structures dividing the plurality of bit line electrode grooves into the bit line grooves and the electrode grooves.

In an example, the method, after forming the first isolation structures, further includes: forming a dielectric layer on a sidewall of the first groove, the dielectric layer covering the first source-drain layers; and forming a plurality of capacitor plates filling the first groove and covering the dielectric layer, adjacent capacitor plates of the plurality of capacitor plates arranged in the third direction being spaced by a respective one of the first isolation structures.

In an example, the method further includes: forming second metal silicide layers in contact with the second source-drain layers, each of the second metal silicide layers being located on a side of a respective one the second source-drain layers close to interior of the second groove.

In an example, the method before forming the second metal silicide layers includes removing a part of each of the second source-drain layers close to interior of the second groove, to form contact ports; and forming the second metal silicide layers in the contact ports.

In an example, forming the first source-drain layers includes: doping the substrate on the sidewalls of the first sub-grooves, to form the first source-drain layers.

Another aspect of the disclosure discloses a semiconductor structure, which includes: a substrate, a first groove and a second groove being provided in the substrate, each of the first groove and the second groove having a depth in a first direction, the first groove including a plurality of first sub-grooves arranged in the first direction, the second groove including a plurality of second sub-grooves arranged in the first direction, and sidewalls of the first sub-grooves and sidewalls of the second sub-grooves being convex outwards; word lines protruding away from the first groove, and each arranged at an interface of adjacent first sub-grooves of the first sub-grooves; first source-drain layers, arranged on the sidewalls of the first sub-grooves; and second source-drain layers protruding away from the second groove, and each arranged at an interface of adjacent second sub-grooves of the second sub-grooves, each of the second source-drain layers being located between the first groove and the second groove, each of the word lines being located between the first groove and the second groove, and each of the second source-drain layers being arranged opposite to a respective one of the word lines.

In an example, the semiconductor structure includes gate dielectric layers each of the gate dielectric layers covering a side surface of a respective one of the word lines away from interior of the first groove and in contact with a respective one of the first source-drain layers and a respective one of the second source-drain layers.

In an example, the semiconductor structure includes: a plurality of capacitor plates, filling the first groove, arranged at intervals in a third direction and extending in the first direction, the third direction being perpendicular to the first direction; and a dielectric layer, arranged on a sidewall of the first groove, and arranged between the first source-drain layers and the capacitor plates.

In an example, the semiconductor structure includes: a plurality of bit lines, filled in the second groove, arranged at intervals in a third direction and extending in the first direction, the third direction being perpendicular to the first direction, and each of the bit lines electrically connected to the second source-drain layers. The word lines extend in the third direction. The semiconductor structure includes a plurality of first source-drain layers arranged at intervals in the third direction, and a plurality of second source-drain layers arranged at intervals in the third direction.

In an example, a length of each of the bit lines in the third direction is equal to a length of each of the first source-drain layers in the third direction.

In an example, the second groove includes bit line grooves and electrode grooves spaced from each other in the third direction, the first groove includes a plurality of first sub-grooves arranged in the first direction, each of the bit line grooves includes a plurality of sub-bit line grooves arranged in the first direction, each of the electrode grooves includes a plurality of sub-electrode grooves arranged in the first direction, sidewalls of the sub-bit line grooves and sidewalls of the sub-electrode grooves are convex outwards, and the second sub-groove includes the sub-electrode groove and the sub-bit line groove, the bit lines are filled in the bit line grooves, each of the second source-drain layers is located at an interface of adjacent sub-bit line grooves of the sub-bit line grooves, and each of the electrode grooves is provided with an electrode layer electrically connected to the substrate.

In an example, the electrode layer includes a first metal silicide layer, a heavily doped layer and a conductive layer which are electrically connected, the heavily doped layer is located in at least the substrate located at an interface of adjacent sub-electrode grooves of the sub-electrode grooves, the conductive layer is filled in a respective one of the electrode grooves, and the first metal silicide layer is located between the conductive layer and the heavily doped layer.

In an example, the semiconductor structure includes: an array region, the substrate in the array region being provided with a transistor group which includes a plurality of layers of transistors arranged in the first direction, each of the transistors including one of the word lines, one of the second source-drain layers and two of the first source-drain layers, the one of the word lines and the one of the second source-drain layers being arranged in a second direction, the two of the first source-drain layers being arranged in the first direction and located on opposite sides of the one of the word lines, and two adjacent transistors of the transistors sharing one of the first source-drain layers in the first direction; and peripheral regions, provided with sub-word line drivers, the sub-word line drivers being electrically connected to the word lines and providing turn-on signals for two adjacent word lines of the word lines in the first direction at different times.

In an example, the word lines include first word lines and second word lines alternately arranged in the first direction, the first word lines being electrically connected to different sub-word line drivers respectively, and the second word lines being connected to a same normally closed signal source.

In an example, there are a plurality of transistor groups, the plurality of transistor groups arranged in the third direction constitute a transistor unit, a plurality of transistor units are arranged in the second direction, the third direction is perpendicular to the second direction, and each of the second direction and the third direction is perpendicular to the first direction, the word lines extend in the third direction, and one of the word lines is shared by the transistors on a same layer of the transistor unit.

In an example, the sub-word line drivers are located on opposite sides of the array region arranged in the third direction, some of the sub-word line drivers electrically connected to a same transistor unit are located on a same side of the array region, and some of the sub-word line drivers electrically connected to adjacent transistor units are located on different sides of the array region.

In an example, the array region includes a storage region and two step regions, the two step regions being arranged in the third direction and located on opposite sides of the storage region. The word lines extend from the storage region into the step regions, and lengths of the word lines increase sequentially in a direction pointing from an upper surface of the substrate to a lower surface of the substrate, the step region is provided with a plurality of lead pillars which extend in the first direction, the lead pillars being connected to the word lines in one-to-one correspondence, and being electrically connected to the sub-word line drivers.

In an example, there are a plurality of transistor groups arranged as an array in the substrate. The semiconductor structure further includes: bit lines filled in the second groove, each of the bit lines being connected to a plurality of second source-drain layers of a same transistor group of the transistor groups; and a plurality of bit line connection lines, extending in the second direction, and arranged in the third direction; each of the bit line connection lines being electrically connected to bit lines. The peripheral regions are further provided with sense amplifiers, and each of the bit line connection lines is electrically connected to a respective one of the sense amplifiers.

In an example, the sense amplifiers are located on opposite sides of the array region in the second direction respectively, and adjacent bit line connection lines of the bit line connection lines are connected to respective sense amplifiers of the sense amplifiers located on two different sides of the array region respectively.

In an example, the second groove includes bit line grooves and electrode grooves spaced in the third direction, each of the electrode grooves is provided with an electrode layer electrically connected to the substrate. The semiconductor structure further includes: an electrode connection line, electrically connected to a plurality of the electrode layers and electrically connected to a bias signal source.

In an example, the semiconductor structure includes: a dielectric layer, located on opposite sidewalls of the first groove; a capacitor plate, filled in the first groove, the dielectric layer being located between the first source-drain layers and the capacitor plate; and a plate connection line, electrically connected to a plurality of the capacitor plates and electrically connected to a capacitor signal source.

In an example, the plate connection line includes a first plate connection line and a plurality of second plate connection lines which are connected with the first plate connection line, the first plate connection line extends in the second direction, the second plate connection lines extend in the third direction, and the second plate connection lines are electrically connected to the plurality of the capacitor plates. The electrode connection line includes a first electrode connection line and a plurality of second electrode connection lines which are connected with the first electrode connection line, the first electrode connection line extends in the second direction, the second electrode connection lines extend in the third direction, and the second electrode connection lines are electrically connected to a plurality of the electrode layers. The first plate connection line and the first electrode connection line are located on opposite sides of the array region respectively, and the second plate connection lines and the second electrode connection lines are alternately arranged in the second direction.

Embodiments of the disclosure will be described in detail below with reference to the drawings. However, it may be understood by those of ordinary skill in the art that numerous technical details have been proposed in various embodiments of the disclosure, to enable a reader to understand the embodiments of the disclosure better. However, technical solutions claimed in the embodiments of the disclosure may be achieved even without these technical details and various variations and modifications based on the following embodiments.

As shown in FIG. 1A, FIG. 1B to FIG. 27A and FIG. 27B, an embodiment of the disclosure provides a method for manufacturing a semiconductor structure, and the method for manufacturing a semiconductor structure provided in the embodiment of the disclosure will be described in detail below with reference to the drawings. It should be noted that FIG. 1A, FIG. 1B to FIG. 27A and FIG. 27B are partial structural diagrams of the semiconductor structure, to facilitate description and clear illustration of steps of the method for manufacturing a semiconductor structure.

With reference to FIG. 1A and FIG. 1B, which is a top view of a semiconductor structure shown in FIG. 1A, a substrate 1 is provided, and a first groove 2 is formed in the substrate 1. The first groove 2 has a depth in a first direction X; the first groove 2 includes multiple first sub-grooves 20 arranged in the first direction X, and sidewalls of the first sub-grooves 20 are convex outwards. That is, a sidewall of the first groove 2 is in a wavy shape. For a more intuitive illustration, the first groove 2 is illustrated with a white filling block in FIG. 1B and subsequent top views.

Specifically, the first groove 2 is formed by a Bosch process. The Bosch process includes a process of performing etching and passivation steps alternately. Firstly, one of the first sub-grooves 20 is formed by isotropic etching; a passivation layer is formed on an inner wall of the first sub-groove 20; the passivation layer at the bottom of the first sub-groove 20 is removed; another first sub-groove 20 is formed by isotropic etching. That is, etching and passivation processes are repeated, to form multiple first sub-grooves 20 which constitute the first groove 2.

In some embodiments, a material of the substrate 1 may be monocrystalline silicon. The monocrystalline silicon material is stable, and compared with IGZO layer and alternate layers of silicon and germanium silicon, defects of monocrystalline silicon are easy to be controlled, which is beneficial to ensuring performance of the semiconductor structure. Furthermore, based on the monocrystalline silicon material, an etching gas used in the Bosch process may be sulfur hexafluoride, and a passivation gas used in the Bosch process may be octafluorocyclobutane.

Furthermore, doped ions may be present in the substrate 1, and types of doped ions in the substrate 1 may be opposite to types of doped ions in a first source-drain layer 61 and a second source-drain layer 62 (with reference to FIG. 27A) which are formed subsequently.

In some embodiments, a depth h of the first sub-groove 20 in the first direction X is 1 um to 2 um, which may facilitate subsequent formation of the first source-drain layer 61 with an appropriate size (with reference to FIG. 24). A size s of the first sub-groove 20 projecting towards the substrate 1 is about tens of nanometers, thereby facilitating subsequent formation of a hole 24 (with reference to FIG. 5).

With reference to FIG. 2A and FIG. 2B, which is a top view of a semiconductor structure shown in FIG. 2A, a first isolation film 21 is formed on a sidewall of the first groove 2, and the first isolation film 21 located at the interface of any adjacent first sub-grooves 20 of the first sub-grooves is arranged to protrude towards interiors of the first sub-grooves 20. That is, since the sidewall of the first groove 2 has a wavy shape, the first isolation film 21 formed on the sidewall of the first groove 2 also has the wavy shape.

Exemplarily, a silicon oxide film is formed by an isotropic deposition process or a thermal oxidation method, to be used as the first isolation film 21. The first isolation film 21 may have a thickness of 20 nm to 50 nm in a second direction Y. It should be noted that when the first isolation film 21 has a thickness in the above range, it may facilitate retaining the first isolation film 21 located on the sidewalls of the first sub-grooves 20 when the first isolation film 21 at the interface of any adjacent first sub-grooves 20 is removed subsequently. That is, when the first isolation film 21 has a too large thickness, the substrate 1 located at the interface of any adjacent first sub-grooves 20 is not easily exposed; and when the first isolation film 21 has a too small thickness, the entire first isolation film 21 may be removed simultaneously.

Furthermore, the first isolation film 21 may also have a portion covering an upper surface of the substrate 1, and the portion of the first isolation film 21 will be removed subsequently.

With reference to FIG. 3A and FIG. 3B, which is a top view of a semiconductor structure shown in FIG. 3A, a part of the first isolation film 21 located at the interface of any adjacent first sub-grooves 20 is etched along the first direction X with the substrate 1 itself as a mask. That is, the first isolation film 21 projected at the interface of any adjacent first sub-grooves 20 is flatten by an anisotropic etching process, so that the first isolation film 21 here becomes thinner.

With reference to FIG. 4, the rest of the first isolation film 21 at the interface of any adjacent first sub-grooves 20 is removed by an isotropic etching process, to expose the substrate 1 located at the interface of the any adjacent first sub-grooves 20. The top view of the semiconductor structure according to this operation is not changed, and may refer to FIG. 3B.

That is, after anisotropic etching, the first isolation film 21 located at the interface of any adjacent first sub-grooves 20 is thinner than the first isolation film 21 on the sidewalls of the first sub-grooves 20; and in the isotropic etching process, the first isolation film 21 located at the interface of any adjacent first sub-grooves 20 may be removed more quickly, thereby exposing a certain width of the substrate 1.

In the first direction X, the substrate 1 exposed at the interface of adjacent first sub-grooves 20 has a width L of 20 nm to 50 nm. It should be noted that when the exposed substrate 1 has a width in the above range, it is beneficial to forming holes 24 with appropriate size subsequently, that is, to avoid the holes 24 each having a too small inner diameter or avoid interconnection of adjacent holes 24.

So far, based on operations shown in FIG. 3A, FIG. 3B and FIG. 4, the first isolation film 21 located at the interface of any adjacent first sub-grooves 20 may be removed, to expose the substrate 1 located at the interface of the any adjacent first sub-grooves 20.

With reference to FIG. 5, the substrate 1 exposed from the first isolation film 21 is etched to form holes 24. The top view of the semiconductor structure according to this operation is not changed, and may refer to FIG. 3B.

Exemplarily, the exposed substrate 1 is isotropically etched, so that the substrate 1 is further opened to form the holes 24. The hole 24 may have a depth of 100 nm to 200 nm in the second direction Y. It should be noted that when the hole 24 has a too small depth, it may be difficult for the hole 24 to provide sufficient filling position for a WL 32, thereby increasing resistance of the WL 32; when the hole 24 has a too large depth, defects such as pores may occur in the WL 32. When the hole 24 has a depth in the above range, it may facilitate the WL 32 to fill the hole subsequently, ensure that the WL 32 has appropriate size, and reduce defects in the WL 32, thereby improving performance of the semiconductor structure.

So far, based on operations shown in FIG. 3A, FIG. 3B, FIG. 4 and FIG. 5, holes 24 protruding away from the first groove 2 each may be formed at the interface of adjacent first sub-grooves 20 of the first sub-groove. That is, the first isolation film 21 may be used as a mask layer for forming the holes 24, to control position and size of each of the formed holes 24.

With reference to FIG. 6, gate dielectric layers 31 are formed on inner walls of the holes 24. The top view of the semiconductor structure according to this operation is not changed, and may refer to FIG. 3B. Exemplarily, silicon oxide is formed on each of the inner walls of the holes 24 by a thermal oxidation process, to be used as the gate dielectric layer 31 of the transistor. In some other embodiments, an atomic layer deposition (ALD) process may be used to deposit a material with high dielectric constant on each of the inner walls of the holes 24, to be used as the gate dielectric layer 31.

With reference to FIG. 7A and FIG. 7B, which is a top view of a semiconductor structure shown in FIG. 7A, an initial WL 321 is formed on a sidewall of the first groove 2 and in the holes 24. Exemplarily, tungsten and titanium nitride are deposited by an isotropic deposition process, to be used as the initial WL 321.

With reference to FIG. 8A and FIG. 8B, which is a top view of a semiconductor structure shown in FIG. 8A, the initial WL 321 located on the sidewall of the first groove 2 and a part of the initial WL 321 in each of the holes 24 are removed by an isotropic etching process, and parts of the initial WL 321 remained in the holes 24 are used as the WLs 32. Each of the WLs 32 is used as a gate of the transistor, and the gate dielectric layer 31 also covers the WL 32. Specifically, the gate dielectric layer 31 covers a side surface of the WL 32 away from interior of the first groove 2.

So far, based on operations shown in FIG. 7A, FIG. 7B, FIG. 8A and FIG. 8B, WLs 32 protruding away from the first groove 2 each may be formed at an interface of adjacent first sub-grooves 20 of the first sub-grooves, and the WLs 32 extend in a third direction Z.

Figures 9A, 9B:
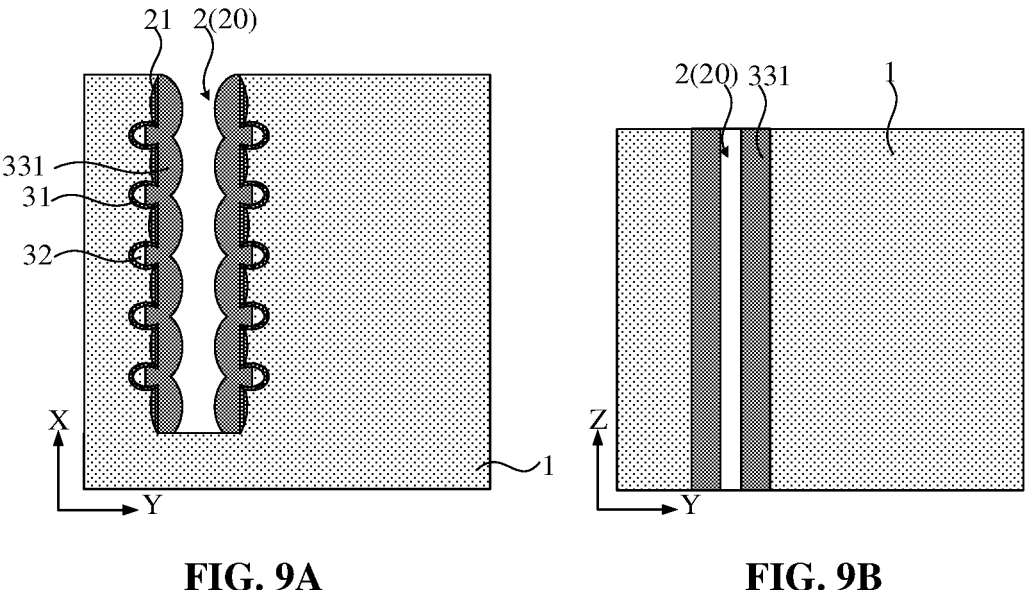

With reference to FIG. 9A and FIG. 9B, which is a top view of a semiconductor structure shown in FIG. 9A, an initial insulation layer 331 is formed in the holes 24 and the sidewalls of the first sub-grooves 20. Exemplarily, silicon nitride is deposited by an isotropic deposition process, to be used as the initial insulation layer 331, thereby closing holes 24. Material of the initial insulation layer 331 may be different from that of the first isolation film 21, thereby avoiding removal of insulation layers 33 during subsequent removal of the first isolation film 21.

With reference to FIG. 10A and FIG. 10B, which is a top view of a semiconductor structure shown in FIG. 10A, the initial insulation layer 331 located on the sidewalls of the first sub-grooves 20 is etched along the first direction X with the substrate 1 itself as a mask, and remained parts of the initial insulation layer 331 are used as insulation layers 33. A sidewall of each of the insulation layers 33 is flush with an opening of a respective one of the holes 24. The gate dielectric layer 31 also covers a surface of the insulation layer 33.

So far, based on operations shown in FIG. 9A, FIG. 9B, FIG. 10A and FIG. 10B, the insulation layers 33 may be formed in the holes 24, and each of the insulation layers 33 are located on a side, facing the first groove 2, of a respective one of the WLs 32. It should be noted that a purpose of forming the insulation layers 33 mainly includes two aspects: firstly, the WL 32 is isolated from a capacitor plate 82 (with reference to FIG. 26A) formed subsequently to avoid short circuit; secondly, the insulation layer 33 may face the first source-drain layer 61 (with reference to FIG. 24) formed subsequently in the first direction X, that is, the face-to-face area between the WL 32 and the first source-drain layer 61 is reduced, thereby reducing a risk of electric leakage.

With reference to FIG. 11A and FIG. 11B, which is a top view of a semiconductor structure shown in FIG. 11A, the method further includes the following operations after forming the WLs 32. A sacrificial layer 22 is filled in the first groove 2. The sacrificial layer 22 may protect the first groove 2 from contamination in subsequent operations of forming a second groove 5, second source-drain layers 62, second metal silicide layers 63, bit lines (BLs) 64, or the like, thereby ensuring performance of the semiconductor structure.

Exemplarily, silicon oxide is deposited in the first groove 2, to be used as the sacrificial layer 22. After the silicon oxide is deposited, a planarization process may also be performed, to wear down an upper surface of the substrate 1 and an upper surface of the sacrificial layer 22. In some embodiments, the material of the sacrificial layer 22 may be the same as that of the first isolation film 21, so that the sacrificial layer 22 and the first isolation film 21 may be subsequently removed by the same process step, thereby simplifying production processes.

With reference to FIG. 12 which is a top view, a part of the substrate 1 and a part of the sacrificial layer 22 are removed to form multiple isolation grooves 4 arranged at intervals, and the multiple isolation grooves 4 extend in the second direction Y and are arranged in the third direction Z.

Exemplarily, a mask is formed on the substrate 1 and the sacrificial layer 22, and the substrate 1 and the sacrificial layer 22 are etched by means of the mask. It should be noted that the WLs 32 cannot be cut off during etching.

With reference to FIG. 13 which is a top view, multiple first isolation structures 41 arranged at intervals are formed, and multiple first isolation structures 41 extend in the second direction Y and are arranged in the third direction Z. The first isolation structures 41 clad multiple WLs 32, that is, the first isolation structures 41 do not truncate the WLs 32. Furthermore, the first isolation structures 41 further divide the sacrificial layer 22 into multiple parts.

Exemplarily, silicon nitride is filled in the isolation grooves 4, to form the first isolation structures 41, and then a planarization process is performed to wear down upper surfaces of the substrate 1, the sacrificial layer 22 and the first isolation structures 41. In some embodiments, the material of the first isolation structures 41 may be different from the material of the sacrificial layer 22, so that consumption of the first isolation structures 41 may be avoided in subsequent removal of the sacrificial layer 22.

With reference to FIG. 14A and FIG. 14B, which is a top view of a semiconductor structure shown in FIG. 14A, after the first isolation structures 41 are formed, a second groove 5 is formed in the substrate 1. The second groove 5 has a depth in a first direction X. The second groove 5 includes multiple second sub-grooves 50 arranged in the first direction X, and sidewalls of the second sub-grooves 50 are convex outwards. That is, the second groove 5 also has a wavy sidewall. Each of the first isolation structures 41 also span the first groove 2 and the second groove 5. For a more intuitive illustration, the second groove 5 is illustrated with a white filling block in FIG. 14B and subsequent top views.

Specifically, the second groove 5 is formed by a Bosch process, and specific processes of forming the second groove 5 may refer to detailed descriptions of the first groove 2.

It should be noted that the material of each of the first isolation structures 41 may be different from the material of the substrate 1, so that the first isolation structures 41 may not be removed, in a process of etching the substrate 1 to form the second groove 5.

In some other embodiments, the second groove 5 extending in the third direction Z may be formed first, and then the first isolation structures 41 extending in the second direction Y may be formed, to divide the second groove 5 into multiple parts. For example, the first groove 2 and the second groove 5 are formed in the same process step; then a sacrificial material is filled in the second groove 5; then structures such as the first isolation film 21, the WLs 32, the insulation layers 33 or the like are formed in the first groove 2; then the first isolation structures 41 are formed to span the first groove 2 and the second groove 5. Since the first groove 2 and the second groove 5 may be integrated in the same process step, production processes are simplified.

With reference to FIG. 15A and FIG. 15B, which is a top view of a semiconductor structure shown in FIG. 15A, an initial second isolation film 511 is formed on a sidewall of the second groove 5, and the initial second isolation film 511 located at the interface of any two adjacent second sub-grooves 50 is arranged to protrude towards interiors of the second sub-grooves 50. That is, since the sidewall of the second groove 5 has a wavy shape, the initial second isolation film 511 formed on the sidewall of the second groove 5 also has the wavy shape.

Exemplarily, a silicon nitride film is formed by an isotropic deposition process, to be used as the initial second isolation film 511.

With reference to FIG. 16A and FIG. 16B, which is a top view of a semiconductor structure shown in FIG. 16A, a part of the initial second isolation film 511 located at the interface of any adjacent second sub-grooves 50 of the second sub-grooves is etched along the first direction X with the substrate 1 itself as a mask. That is, the initial second isolation film 511 projected at the interface of the any adjacent second sub-grooves 50 is flatten by an anisotropic etching process, so that the initial second isolation film 511 here becomes thinner.

Figure 17:
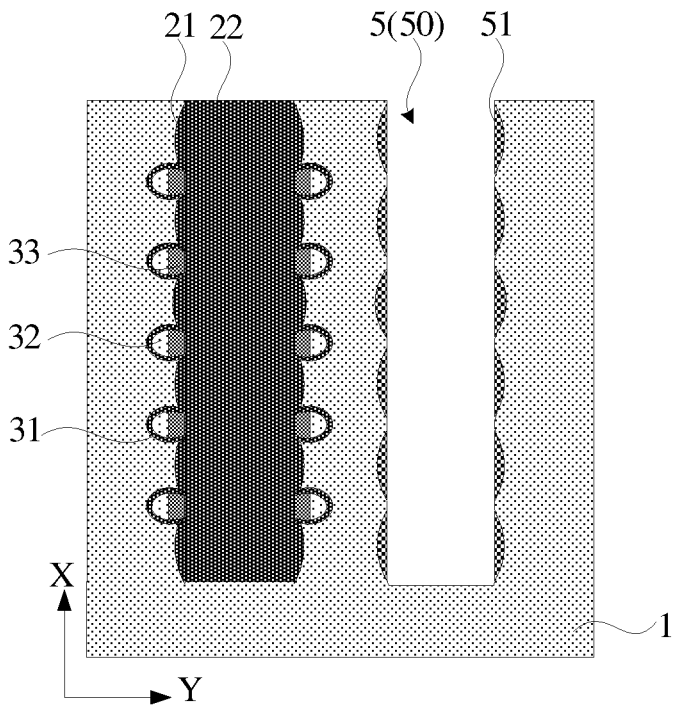

With reference to FIG. 17, the rest of the initial second isolation film 511 located at the interface of the any adjacent second sub-grooves 50 is removed by an isotropic etching process, to expose the substrate 1 located at the interface of the any adjacent second sub-grooves 50. That is, in the isotropic etching process, the thinner initial second isolation film 511 located at the interface of the any adjacent second sub-grooves 50 may be removed more quickly, thereby exposing a certain width of the substrate 1. The top view of the semiconductor structure according to this operation is not changed, and may refer to FIG. 16B.

So far, based on operation shown in FIG. 16A, FIG. 16B and FIG. 17, the initial second isolation film 511 located at the interface of any adjacent second sub-grooves 50 may be removed, to expose the substrate 1 located at the interface of the any adjacent second sub-grooves 50.

Figure 18:
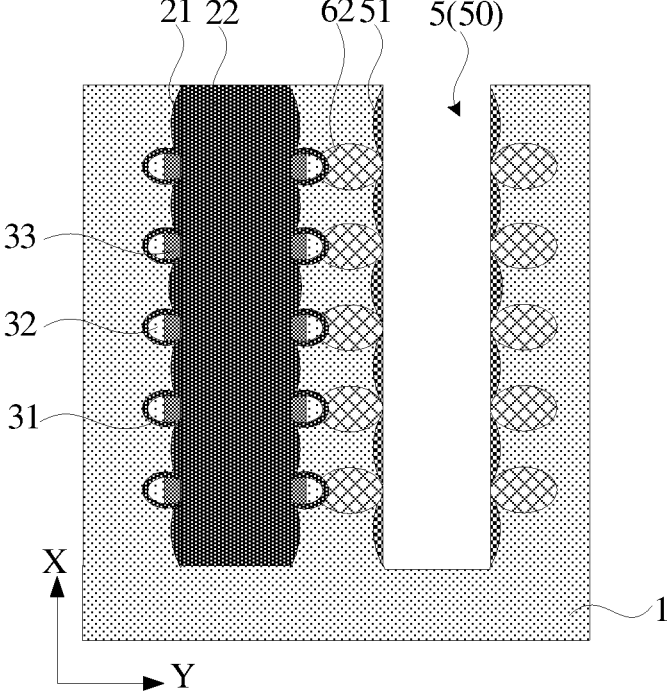

With reference to FIG. 18, the substrate 1 exposed from the second isolation film 51 is doped, to form second source-drain layers 62. Exemplarily, n-type doped ions are injected into the substrate 1 by a plasma doping process, to form the second source-drain layers 62. The top view of the semiconductor structure according to this operation is not changed, and may refer to FIG. 16B.

Each of the second source-drain layers 62 is located between the first groove 2 and the second groove 5, each of the WLs 32 is located between the first groove 2 and the second groove 5, and each of the second source-drain layers 62 is arranged opposite to a respective one of the WLs 32. Each of the second source-drain layers 62 is also in contact with a respective one of the gate dielectric layers 31.

Furthermore, second source-drain layers 62 adjacent to each other arranged in the third direction Z are spaced by a respective one of the first isolation structures 41, thereby avoiding mutual interference between the second source-drain layers. Second source-drain layers 62 adjacent to each other arranged in the first direction X are spaced by the second isolation film 51, thereby avoiding interconnection of the second source-drain layers.

So far, based on operations shown in FIG. 16A, FIG. 16B, FIG. 17 and FIG. 18, the second source-drain layers 62 protruding away from the second groove 5 each may be formed at the interface of adjacent second sub-grooves 50. That is, the second isolation film 51 may be used as a mask for forming the second source-drain layers 62, thereby avoiding interconnection of adjacent second source-drain layers 62 in the first direction X.

Figure 19:
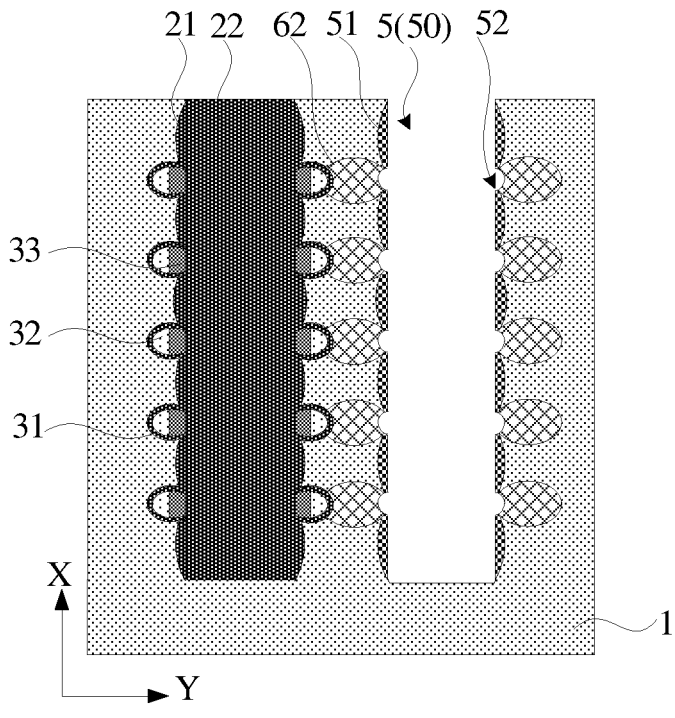

With reference to FIG. 19, a part of each of the second source-drain layers 62 close to interior of the second groove 5 is removed to form contact ports 52. Exemplarily, a part of each of the second source-drain layers 62 exposed from the second isolation film 51 is removed by isotropic etching, to increase an exposed area of each of the second source-drain layers 62. The top view of the semiconductor structure according to this operation is not changed, and may refer to FIG. 16B.

Figure 20:
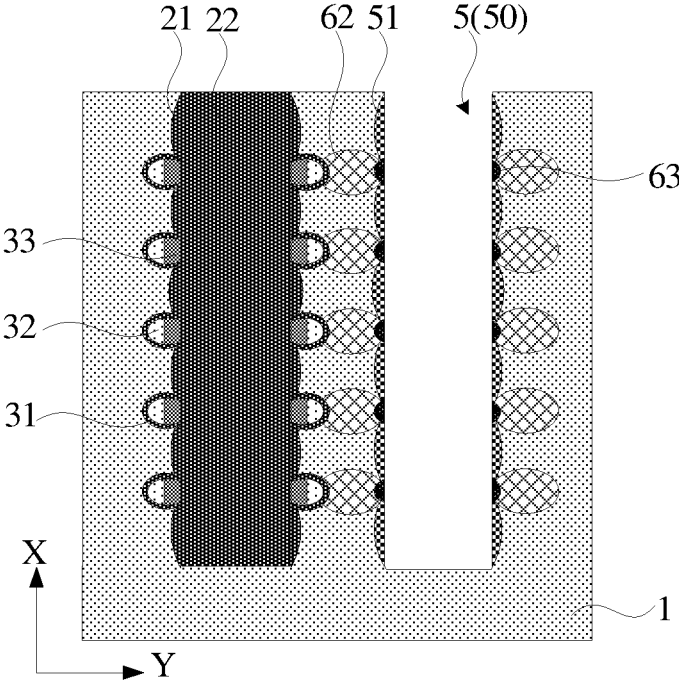

With reference to FIG. 20, second metal silicide layers 63 each are formed in a respective one of the contact ports 52. That is, the second metal silicide layer 63 in contact with the second source-drain layer 62 is formed and arranged on a side of the second source-drain layer 62 close to interior of the second groove 5. Exemplarily, a metal layer is deposited in the contact port 52, and then annealed so that the metal layer reacts with the second source-drain layer 62 to generate the second metal silicide layer 63.

The second metal silicide layer 63 may reduce contact resistance between subsequently formed BL 64 and the second source-drain layer 62, thereby improving electrical performance of the semiconductor structure. In some other embodiments, the second metal silicide layers 63 may not be formed.

It should be noted that the contact port 52 may increase a contact area between the second metal silicide layer 63 and the second source-drain layer 62, thereby reducing the contact resistance. In some embodiments, the second metal silicide layer 63 may only be attached to an inner wall of the contact port 52 without fully filling the contact port 52, that is, the subsequently formed BL 64 may also be filled in the contact port 52, so that it is beneficial to increasing filling space of the BL 64 and increase contact area between the BL 64 and the second metal silicide layer 63. In some other embodiments, the second metal silicide layer 63 may also fully fill the contact port 52.

With reference to FIG. 21A and FIG. 21B, multiple BLs 64 filling the second groove 5 are formed, in which the BLs 64 extend in the first direction X and each of the BLs 64 are electrically connected to the second source-drain layers 62, that is, each of the BLs 64 is electrically connected to multiple second source-drain layers 62 in the first direction X. Two BLs 64 adjacent to each other arranged in the third direction Z are spaced by a respective one of the isolation structures 41. Each of the BLs 64 is also in contact with the second metal silicide layers 63.

Exemplarily, metals such as tungsten, titanium nitride or the like are deposited in the second groove 5, to be used as the BLs 64. After the metals are deposited, the metals are polished and worn down.

With reference to FIG. 22A and FIG. 22B, a part of each of the BLs 64 is etched back, and a third isolation film 57 is formed to close a top of the second groove 5. The third isolation film 57 may protect the BLs 64, to avoid contamination and oxidation thereof.

With reference to FIG. 23A and FIG. 23B, after the BLs 64 are formed, the sacrificial layer 22 is removed. Furthermore, the first isolation film 21 located on the sidewalls of the first sub-grooves 20 is also removed, to expose the sidewalls of the first sub-grooves 20.

Exemplarily, the sacrificial layer 22 and the first isolation film 21 are removed by a wet etching process.

With reference to FIG. 24, after the sacrificial layer 22 is removed, first source-drain layers 61 are formed on the sidewalls of the first sub-grooves 20. Each of the first source-drain layers 61 is also in contact with a respective one of the gate dielectric layers 31. Specifically, the sidewalls of the first sub-grooves 20 are doped to form the first source-drain layers 61. Exemplarily, n-type doping ions are injected in the substrate 1 exposed within the first groove 2 by a plasma doping process.

It should be noted that the first source-drain layer 61 has a shallow doping depth in the second direction Y, so that the first source-drain layer 61 may be staggered in the first direction X with respect to the WL 32, to avoid an overlapping region between the first source-drain layer 61 and the WL 32, or reduce an overlapping area between the first source-drain layer 61 and the WL 32, thereby avoiding a problem of electric leakage between the first source-drain layer 61 and the WL 32.

Furthermore, first source-drain layers 61 adjacent to each other arranged in the third direction Z are spaced by a respective one of the first isolation structures 41, to avoid mutual interference between adjacent first source-drain layers 61.

With reference to FIG. 25A and FIG. 25B, an initial dielectric layer 811 is formed on the sidewall of the first groove 2 and on the upper surface of the substrate 1, and also covers the first source-drain layers 61. Exemplarily, a material with a high dielectric constant is deposited to form the initial dielectric layer 811. The material with a high dielectric constant is beneficial to improving capacitance of a capacitor.

With reference to FIG. 26A and FIG. 26B, the initial dielectric layer 811 located on the upper surface of the substrate 1 is removed, and the initial dielectric layer 811 located on the sidewall of the first groove 2 is used as a dielectric layer 81.

With continuous reference to FIG. 26A and FIG. 26B, multiple capacitor plates 82 filling the first groove 2 are formed, and also cover the dielectric layer 81. Multiple capacitor plates 82 are arranged in the third direction Z and extend in the first direction X. The capacitor plates 82 adjacent to each other arranged in the third direction Z are spaced by a respective one of the first isolation structures 41.

That is, the first source-drain layer 61, the capacitor plate 82 and the dielectric layer 81 constitute a capacitor connected to a transistor constituted by the first source-drain layers 61, the second source-drain layer 62 and the WL 32. It may be understood that since the first source-drain layer 61 is also used as an electrode plate of the capacitor, it is beneficial to omitting an electrical connection structure between the first source-drain layer 61 and the capacitor, and production processes are simpler in this way.

Exemplarily, metals such as tungsten, titanium nitride or the like are filled in the first groove 2, to be used as the capacitor plates 82, and then the capacitor plates 82 and the upper surface of the substrate 1 are polished.

With reference to FIG. 27A and FIG. 27B, a part of each of the capacitor plates 82 is etched back, and a fourth isolation film 23 is deposited to close a top of the first groove 2. The fourth isolation film 23 may protect the capacitor plates 82. Exemplarily, a material of the fourth isolation film 23 may be silicon nitride.

So far, based on operations shown in FIG. 1A to FIG. 27B, early-stage manufacturing of the 3D DRAM may be completed. It is worth noting that when process steps are performed in the above sequence, it is beneficial to reducing contamination of the semiconductor structure and reduce impurity residues. In some other embodiments, the sequence of process steps may also be adjusted. For example, the second groove 5 is formed first, and structures such as the second source-drain layers 62, the second metal silicide layers 63, the BLs 64 or the like are formed based on the second groove 5 with a wavy shape; then the first groove 2 is formed, and structures such as the WLs 32, the dielectric layer 81, the capacitor plates 82 or the like are formed based on the first groove 2 with a wavy shape. For another example, structures such as the first groove 2, the WLs 32, the first source-drain layers 61, the dielectric layer 81, the capacitor plates 82 or the like are formed first, and then structures such as the second groove 5, the second source-drain layers 62, the BLs 64 or the like are formed.

In summary, the first groove 2 and the second groove 5 each having a wavy shape are formed by the Bosch process, and the WLs 32 and the first source-drain layers 61 are formed based on the first groove 2 with a wavy shape, and the second source-drain layers 62 are formed based on the second groove 5 with a wavy shape. Therefore, transistors are formed in the silicon substrate, usage of IGZO and superlattice technologies are avoided, which may reduce defects of the semiconductor structure and improve performance of the semiconductor structure.

Another embodiment of the disclosure further provides a method for manufacturing a semiconductor structure, the manufacturing method is substantially the same as the method for manufacturing a semiconductor structure according to the foregoing embodiments, and a main difference therebetween lies in that this manufacturing method also includes forming an electrode layer 7, and the electrode layer 7 and the BL 64 are arranged at intervals in the third direction Z. The manufacturing method will be described in detail below. Parts of the manufacturing method which are the same as or similar to those of the manufacturing method according to the foregoing embodiments may refer to the foregoing detailed descriptions and will not be elaborated here.

With reference to FIG. 1 to FIG. 13, structures such as a first groove 2, WLs 32, insulation layers 33, gate dielectric layers 31, first isolation structures 41, a sacrificial layer 22 or the like are formed. Detailed descriptions of operations of manufacturing the above structures may refer to the manufacturing method according to the foregoing embodiments and will not be elaborated here.

A reference is made to FIG. 28A and FIG. 28B, in which FIG. 28B is a top view, and FIG. 28A is a cross-sectional view in an A-A1 direction of FIG. 28B. After the first isolation structures 41 are formed, a second groove 5 is formed in the substrate 1, and the second groove 5 has a depth in the first direction X; the first groove 2 and the second groove 5 are arranged in the second direction Y; the second groove 5 includes multiple second sub-grooves 50 arranged in the first direction X, and a sidewall of each of the second sub-grooves 50 is convex outwards. That is, the second groove 5 also has a wavy sidewall. Each of the first isolation structures 41 also span the first groove 2 and the second groove 5. The first isolation structures 41 divide the second groove 5 into multiple BL electrode grooves 54 arranged at intervals. It should be noted that for a more intuitive illustration, the second groove 5 is illustrated with a white filling block in FIG. 28B and subsequent top view.

Specifically, the second groove 5 is formed by a Bosch process, and specific processes of forming the second groove 5 may refer to detailed descriptions of the first groove 2.

A reference is made to FIG. 29A and FIG. 29B, in which FIG. 29B is a top view, and FIG. 29A is a cross-sectional view in an A-A1 direction of FIG. 29B. Initial second isolation structures 531 filling the second groove 5 are formed, that is, the initial second isolation structures 531 are filled in the BL electrode grooves 54. The initial second isolation structures 531 and the first isolation structures 41 are alternately arranged in the third direction Z. Exemplarily, silicon nitride is deposited in the second groove 5, to be used as the initial second isolation structures 531, that is, a material of each of the initial second isolation structures 531 may be the same as that of each of the first isolation structures 41.

A reference is made to FIG. 30A and FIG. 30B, in which FIG. 30B is a top view, and FIG. 30A is a cross-sectional view in A-A1 and B-B1 directions of FIG. 30B. The initial second isolation structures 531 are patterned to form second isolation structures 53. The second isolation structures 53 each extend in the second direction Y and each divide a respective one of the BL electrode grooves 54 into a BL groove 541 and an electrode groove 542. That is, the second groove 5 includes BL grooves 541 and electrode grooves 542 spaced from each other in the third direction Z. Each of the BL grooves 541 includes multiple sub-BL grooves 5410 arranged in the first direction X, and each of the electrode grooves 542 includes multiple sub-electrode grooves 5420 arranged in the first direction X. Sidewalls of the sub-electrode grooves 5420 and sidewalls of the sub-BL grooves 5410 are convex outwards. Each of the second sub-grooves 50 includes the sub-electrode groove 5420 and the sub-BL groove 5410 in the third direction Z.

A reference is made to FIG. 31A and FIG. 31B, in which FIG. 31B is a top view, and FIG. 31A is a cross-sectional view in A-A1 and B-B1 directions of FIG. 31B. An initial second isolation film 511 is formed on sidewalls of the BL grooves 541 and the electrode grooves 542; the initial second isolation film 511 located at an interface of adjacent sub-BL grooves 5410 is arranged to protrude towards interior of the BL groove 541; the initial second isolation film 511 located at an interface of adjacent sub-electrode grooves 5420 is arranged to protrude towards interior of the electrode groove 542. That is, since the sidewall of each of the BL groove 541 and the electrode groove 542 has a wavy shape, the initial second isolation film 511 formed on the sidewall of each of the BL groove 541 and the electrode groove 542 also has a wavy shape.

Exemplarily, a silicon nitride film is formed by an isotropic deposition process, to be used as the initial second isolation film 511.

With reference to FIG. 32A and FIG. 32B, in which FIG. 32B is a top view, and FIG. 32A is a cross-sectional view in A-A1 and B-B1 directions of FIG. 32B. With the substrate 1 itself as a mask, parts of the initial second isolation film 511 each located at the interface of adjacent sub-BL grooves 5410 and parts of the initial second isolation film 511 each located at the interface of adjacent sub-electrode grooves 5420 are etched along the first direction X. That is, the initial second isolation film 511 protruding at the interface of any adjacent sub-BL grooves 5410 and the initial second isolation film 511 protruding at the interface of any adjacent sub-electrode grooves 5420 are flatten by an anisotropic etching process.

Figure 33:
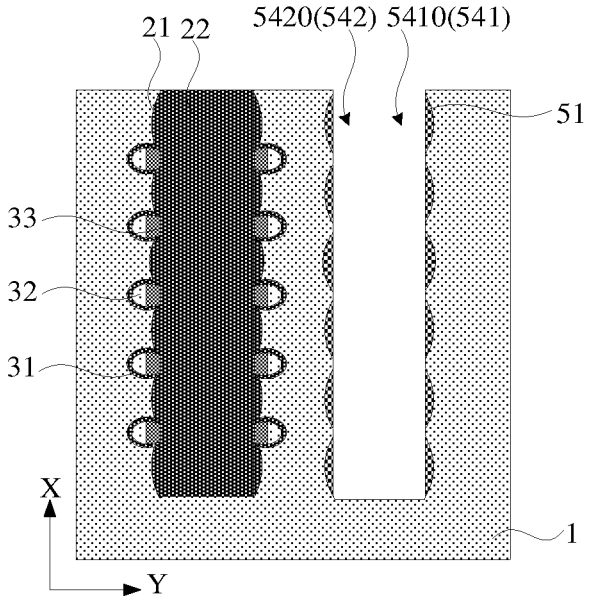

With reference to FIG. 33, the rest of the initial second isolation film 511 located at the interface of any adjacent sub-BL grooves 5410 is removed by an isotropic etching process, to expose the substrate 1 located at the interface of the any adjacent sub-BL grooves 5410; and the rest of the initial second isolation film 511 located at the interface of any adjacent sub-electrode grooves 5420 is removed by an isotropic etching process, to expose the substrate 1 located at the interface of the any adjacent sub-electrode grooves 5420. The initial second isolation film 511 located on the sidewalls of the sub-electrode grooves 5420 and the sidewalls of the sub-BL grooves 5410 is used as the second isolation film 51. That is, in the isotropic etching process, the thinner initial second isolation film 511 located at the interface of adjacent sub-BL grooves 5410 and at the interface of adjacent sub-electrode grooves 5420 may be removed more quickly, thereby exposing a certain width of the substrate 1. The top view of the semiconductor structure according to this step is not changed, and may refer to FIG. 32B.

So far, based on operations shown in FIG. 31A, FIG. 31B, FIG. 32A, FIG. 32B and FIG. 33, the second isolation film 51 located on the sidewalls of the sub-BL grooves 5410 and the sidewalls of the sub-electrode grooves 5420 may be formed, the substrate 1 located at the interface of adjacent sub-BL grooves 5410 and the substrate 1 located at the interface of adjacent sub-electrode grooves 5420 may be exposed form the second isolation film 51.

A reference is made to FIG. 34A to FIG. 34C, in which FIG. 34C is a top view, FIG. 34A is a cross-sectional view in an A-A1 direction of FIG. 34C, and FIG. 34B is a cross-sectional view in a B-B1 direction of FIG. 34C. A first mask layer 55 filling the electrode grooves 542 is formed and exposes the BL grooves 541. Exemplarily, photoresist is filled in the electrode grooves 542 and the BL grooves 541, to be used as an initial first mask layer, and photolithography is performed on the initial first mask layer, to remove the initial first mask layer in the BL grooves 541, and the rest of the initial first mask layer is used as the first mask layer 55. A part of the first mask layer 55 is also located on the upper surface of the substrate 1.

With continuous reference to FIG. 34A, the second source-drain layers 62 protruding away from the second groove 5 each are formed at the interface of adjacent sub-BL grooves 5410. Each of the second source-drain layers 62 is also in contact with a respective one of the gate dielectric layers 31. Exemplarily, after the second isolation film 51 is formed, the substrate 1 located at the interface of any adjacent sub-BL grooves 5410 is plasma doped to form the second source-drain layers 62. That is, the second isolation film 51 may be a mask for forming the second source-drain layers 62, to control position and size of each of the second source-drain layers 62 and avoid interconnection of adjacent second source-drain layers 62 in the first direction X. Doped ions of the second source-drain layer 62 may be n-type ions.

Each of the second source-drain layers 62 and each of the WLs 32 are located between the first groove 2 and the second groove 5, and each of the second source-drain layers 62 is arranged opposite to a respective one of the WLs 32.

The first isolation structure 41 is arranged between adjacent second source-drain layers 62 in the third direction Z. Therefore, the adjacent second source-drain layers 62 in the third direction Z are isolated from each other. The second isolation film 51 is arranged between adjacent second source-drain layers 62 in the first direction X. Therefore, the adjacent second source-drain layers 62 in the first direction X are also isolated from each other.

With reference to FIG. 35, a part of each of the second source-drain layers 62 close to interior of the second groove 5 is removed, to form contact ports 52. Exemplarily, a part of each of the second source-drain layers 62 exposed from the second isolation film 51 is removed by isotropic etching and by taking the first mask layer 55 and the second isolation film 51 as masks, to increase an exposed area of each of the second source-drain layers 62. The top view and cross-sectional view in the B-B1 direction of the semiconductor structure according to this operation are not changed, and may refer to FIG. 34C and FIG. 34B.

Figures 36C, 37A:
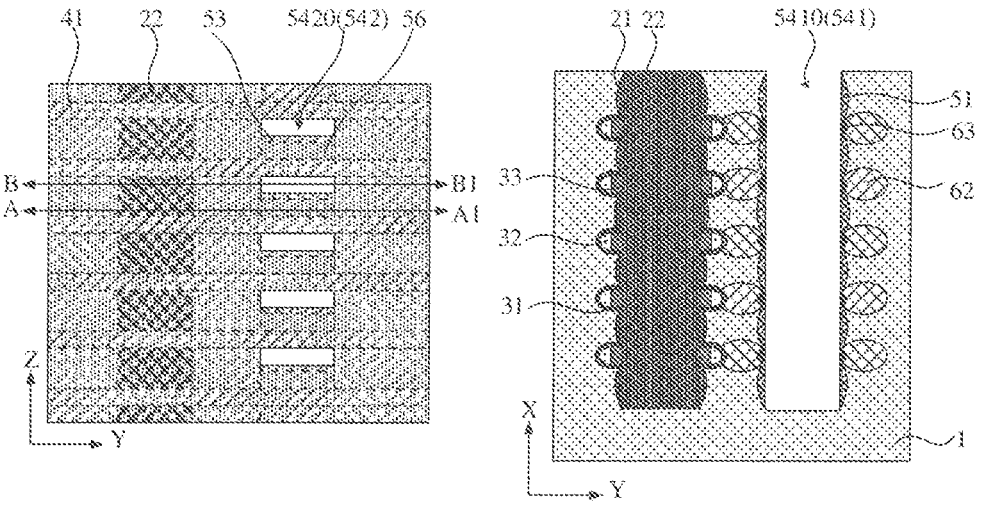

A reference is made to FIG. 36A to FIG. 36C, in which FIG. 36C is a top view, FIG. 36A is a cross-sectional view in an A-A1 direction of FIG. 36C, and FIG. 36B is a cross-sectional view in a B-B1 direction of FIG. 36C. The first mask layer 55 is removed, and a second mask layer 56 filling the BL grooves 541 is formed and exposes the electrode grooves 542. Exemplarily, old photoresist is cleaned, and new photoresist is filled in the BL grooves 541 and the electrode grooves 542, to be used as an initial second mask layer, and photolithography is performed on the initial second mask layer, to remove the initial second mask layer in the electrode grooves 542, and the rest of the initial second mask layer is used as the second mask layer 56. A part of the second mask layer 56 is also located on the upper surface of the substrate 1.

With continuous reference to FIG. 36B, the substrate 1 located at an interface of adjacent sub-electrode grooves 5420 is heavily doped, to form a heavily doped layer 71. Exemplarily, p-type doped ions are injected into the substrate 1 by a plasma doping process, to be used as the heavily doped layer 71. That is, the type of doped ions in the heavily doped layer 71 may be the same as that of doped ions in the substrate 1. In this way, it may provide a fast outflow channel for charges in the substrate 1 and avoid accumulation of charges in the substrate 1.

In the second direction Y, a doping depth of the heavily doped layer 71 is less than that of the second source-drain layer 62. That is, a smaller doping depth of the heavily doped layer 71 may avoid contact between the second source-drain layer 62 and the heavily doped layer 71 and avoid contact between the heavily doped layer 71 and the gate dielectric layer 31, thereby avoiding a problem of electric leakage or short circuit.

It should be noted that since second isolation film 51 on the sidewall of the sub-BL groove 5410 and the second isolation film 51 on the sidewall of the sub-electrode groove 5420 are formed in the same process step, production processes are simpler. In some other embodiments, the second isolation film 51 may be formed only on the sidewall of the sub-BL groove 5410, but not formed on the sidewall of the sub-electrode groove 5420, so that the entire sidewall of the electrode groove 542 may be exposed, and the heavily doped layer 71 may be formed on the entire sidewall of the electrode groove 542, and a contact area between the heavily doped layer 71 and the substrate 1 may be increased, thereby increasing an outflow rate of the charges in the substrate 1.

Figures 37B, 37C:
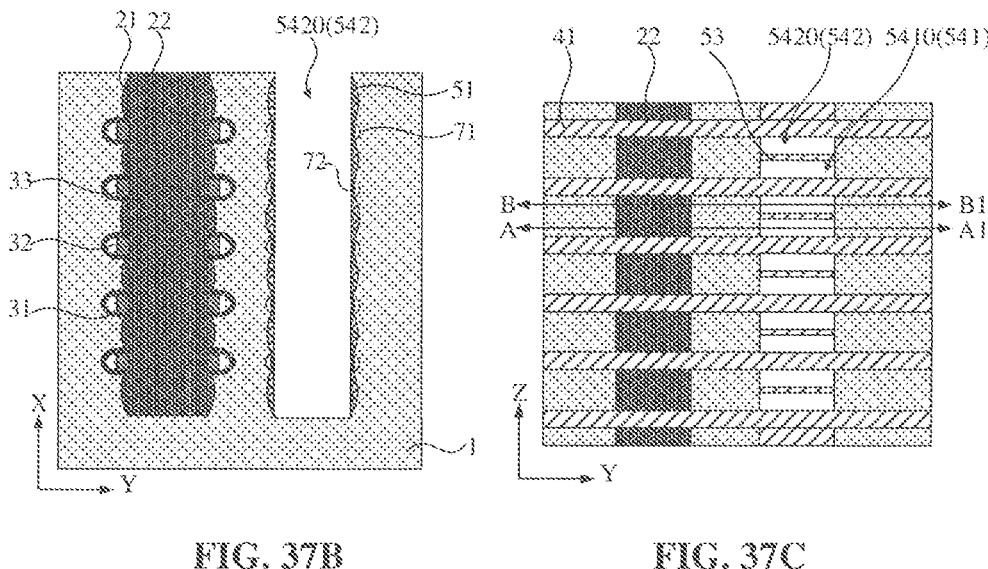

A reference is made to FIG. 37A to FIG. 37C, in which FIG. 37C is a top view, FIG. 37A is a cross-sectional view in an A-A1 direction of FIG. 37C, and FIG. 37B is a cross-sectional view in a B-B1 direction of FIG. 37C. The second mask layer 56 is removed to expose the BL grooves 541.

With continuous reference to FIG. 37A, second metal silicide layers 63 each are formed on a side of a respective one of the second source-drain layers 62 facing interior of the BL groove 541. Each of the second metal silicide layers 63 is also located in a respective one of the contact ports 52. Exemplarily, a metal layer is deposited in the contact port 52, and then annealed so that the metal layer reacts with the second source-drain layer 62 to generate the second metal silicide layer 63.

It should be noted that the contact port 52 may increase a contact area between the second metal silicide layer 63 and the second source-drain layer 62, thereby reducing contact resistance. In some embodiments, the second metal silicide layer 63 may only be attached to an inner wall of the contact port 52 without fully filling the contact port 52, that is, the subsequently formed BL 64 may also be filled in the contact port 52, so that it is beneficial to increasing filling space of the BL 64 and increase contact area between the BL 64 and the second metal silicide layer 63. In some other embodiments, the second metal silicide layer 63 may also fully fill the contact port 52.

With reference to FIG. 37B, a first metal silicide layer 72 is formed on a side of the heavily doped layer 71 facing interior of the electrode groove 542. Exemplarily, a metal layer is formed on a sidewall of the heavily doped layer 71 and subjected to a high temperature annealing process, so that the metal layer reacts with the heavily doped layer 71, thereby generating the first metal silicide layer 72.

In some embodiments, the first metal silicide layer 72 and the second metal silicide layer 63 may be formed simultaneously, thereby simplifying production processes and reducing production costs. The first metal silicide layer 72 may be located between the heavily doped layer 71 and a subsequently formed conductive layer 73, thereby reducing contact resistance between the subsequently formed conductive layer 73 and the heavily doped layer 71; the second metal silicide layer 63 may be located between a subsequently formed BL 64 and the second source-drain layer 62, thereby reducing contact resistance between the formed BL 64 and the second source-drain layer 62, and improving electrical performance of the semiconductor structure. In some other embodiments, the first metal silicide layer 72 and the second metal silicide layer 63 may not be formed.

A reference is made to FIG. 38A to FIG. 38C, in which FIG. 38C is a top view, FIG. 38A is a cross-sectional view in an A-A1 direction of FIG. 38C, and FIG. 38B is a cross-sectional view in a B-B1 direction of FIG. 38C. BLs 64 filling the BL grooves 541 are formed, each of the BLs being connected to the second metal silicide layers 63, and electrically connected to the second source-drain layers 62. A conductive layer 73 filling a respective one of the electrode grooves 542 is formed and electrically connected to the heavily doped layer 71.

Exemplarily, metal material layers such as tungsten, titanium nitride or the like are simultaneously deposited in BL grooves 541 and the electrode grooves 542, the metal material layer located in the BL grooves 541 can be used as the BLs 64, and the metal material layer located in the electrode grooves 542 can be used as the conductive layers 73. Since the BLs 64 and the conductive layers 73 may be formed in the same process step, production processes are simpler. After the metal material layers are deposited, the metal material layers may be polished and worn down.

As can be seen from FIG. 38A to FIG. 38C, the BLs 64 extend in the first direction X, and each of the BLs 64 is electrically connected to multiple second source-drain layers 62 in the first direction X. The first isolation structure 41 and the second isolation structure 53 are arranged between two adjacent BLs 64 in the third direction Z. The conductive layer 73 extends in the first direction X, and the first isolation structure 41 and the second isolation structure 53 are arranged between two adjacent conductive layers 73 in the third direction Z. That is, the BLs 64 may be parallel to the conductive layers 73, and the BLs 64 and the conductive layers 73 are alternately arranged in the third direction Z.

So far, based on operation shown in FIG. 36A to FIG. 36C, FIG. 37A to FIG. 37C and FIG. 38A to FIG. 38C, the electrode layer 7 may be formed in the electrode groove 542, and the electrode layer 7 is electrically connected to the substrate 1. The electrode layer 7 includes the first metal silicide layer 72, the conductive layer 73 and the heavily doped layer 71. In some other embodiments, the electrode layer 7 may include the conductive layer 73 and the heavily doped layer 71, or the electrode layer 7 may be constituted by the conductive layer 73 only.

Figures 39A, 39B:
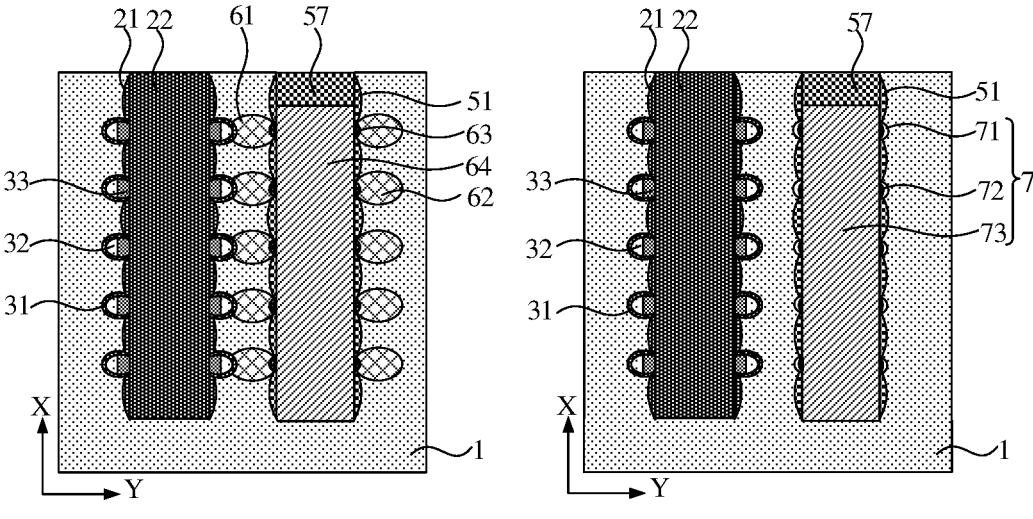
Figure 39C:
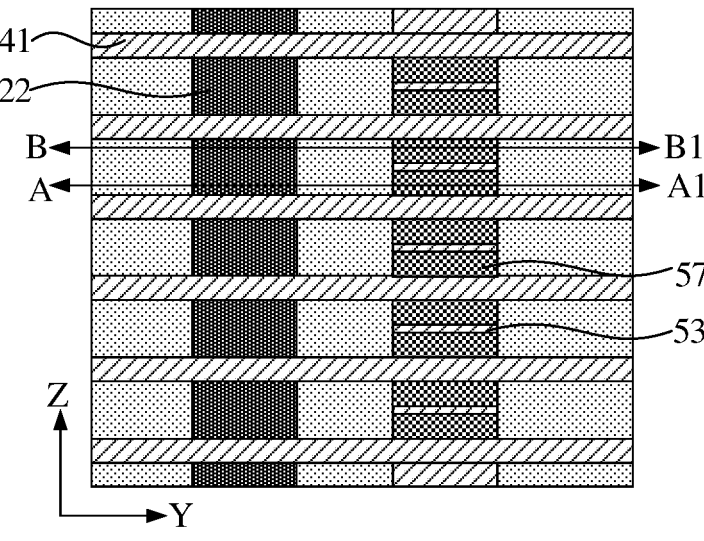

A reference is made to FIG. 39A to FIG. 39C, in which FIG. 39C is a top view, FIG. 39A is a cross-sectional view in an A-A1 direction of FIG. 39C, and FIG. 39B is a cross-sectional view in a B-B1 direction of FIG. 39C. A part of each of the BLs 64 and a part of each of the conductive layers 73 are etched back, and a third isolation film 57 is formed to close a top of each of the BL grooves 541 and a top of each of the electrode grooves 542. The third isolation film 57 may protect the BLs 64 and the conductive layers 73, to avoid contamination and oxidation thereof.

A reference is made to FIG. 40A and FIG. 40B, in which FIG. 40B is a top view, and FIG. 40A is a cross-sectional view in an A-A1 direction of FIG. 40B. The sacrificial layer 22 and the first isolation film 21 located on the sidewalls of the first sub-grooves 20 are removed, to expose the sidewalls of the first sub-grooves 20. Exemplarily, the sacrificial layer 22 and the first isolation film 21 are removed by a wet etching process.

With reference to FIG. 41A and FIG. 41B, first source-drain layers 61 are formed on the sidewalls of the first sub-grooves 20. The top view of the semiconductor structure according to this operation is not changed, and may refer to FIG. 40B. FIG. 41A is a cross-sectional view in an A-A1 direction of FIG. 40B, FIG. 41B is a cross-sectional view in a B-B1 direction of FIG. 40B. The first source-drain layer 61 is also in contact with the gate dielectric layer 31. Furthermore, a respective one of the first isolation structures 41 is arranged between adjacent first source-drain layers 61 in the third direction Z, to avoid mutual interference between the adjacent first source-drain layers 61. Furthermore, insulation layers 33 each are arranged between adjacent first source-drain layers 61 in the first direction X.

Specifically, the sidewalls of the first sub-grooves 20 are doped to form the first source-drain layers 61. Exemplarily, n-type doping ions are injected in the substrate 1 exposed within the first groove 2 by a plasma doping process.

A reference is made to FIG. 42A and FIG. 42B, in which FIG. 42B is a top view, and FIG. 42A is a cross-sectional view in an A-A1 direction of FIG. 42B. A dielectric layer 81 is formed on the sidewall of the first groove 2, and also covers the first source-drain layers 61.

With continuous reference to FIG. 42A and FIG. 42B, multiple capacitor plates 82 arranged at intervals are formed in the first groove 2, and also cover the dielectric layer 81; multiple capacitor plates 82 are arranged in the third direction Z and each extend in the first direction X. The capacitor plates 82 adjacent to each other arranged in the third direction Z are spaced by a respective one of the first isolation structures 41.

A reference is made to FIG. 43A to FIG. 43D, in which FIG. 43D is a top view, FIG. 43A is a cross-sectional view in an A-A1 direction of FIG. 43D, FIG. 43B is a cross-sectional view in a B-B1 direction of FIG. 43D, and FIG. 43C is a cross-sectional view in a C-C1 direction of FIG. 43D. A part of each of the capacitor plates 82 is etched back, and a fourth isolation film 23 is deposited to close the top of the first groove 2.

So far, based on operations shown in FIG. 1A to FIG. 13 and FIG. 28A to FIG. 3C, early-stage manufacturing of the 3D DRAM may be completed. It is worth noting that when process steps are performed in the above sequence, it is beneficial to reducing contamination of the semiconductor structure and reduce residues of impurities. In some other embodiments, the sequence of process steps may also be adjusted. For example, the second groove 5 is formed first, and the second groove 5 is divided into the BL grooves 541 and the electrode grooves 542; then, structures such as the second source-drain layers 62, the second metal silicide layers 63, the BLs 64 or the like are formed based on the BL grooves 541 with a wavy shape, and the electrode layer 7 is formed in a respective one of the electrode grooves 542; then, the first groove 2 is formed, and structures such as the WLs 32, the dielectric layer 81, the capacitor plates 82 or the like are formed based on the first groove 2 with a wavy shape. For another example, structures such as the first groove 2, the WLs 32, the first source-drain layers 61, the dielectric layer 81, the capacitor plates 82 or the like are formed first, and then, structures such as the second groove 5, the second source-drain layers 62, the BLs 64 or the like are formed.

In summary, the manufacturing method according to embodiment forms the electrode layer 7 electrically connected to the substrate 1 based on the manufacturing method according to the previous embodiment, and the electrode layer 7 may be connected to a power supply in a peripheral region. Therefore, it may avoid accumulation of charges in the substrate 1, thereby avoiding a floating body effect, and improving performance of the semiconductor structure. Furthermore, the electrode layer 7 may also include the heavily doped layer 71 and the first metal silicide layer 72, to guide fast outflow of charges.

Yet another embodiment of the disclosure further provides a semiconductor structure which may be manufactured by the methods for manufacturing a semiconductor structure described in two previous embodiments, and detailed descriptions of the semiconductor structure may refer to the foregoing detailed descriptions and will not be elaborated here. The semiconductor structure will be described in detail below with reference to the drawings.

In a first example, as shown in FIG. 27A and FIG. 27B, the semiconductor structure includes: a substrate 1, WLs 32, first source-drain layers 61 and second source-drain layers 61. A first groove 2 and a second groove 5 are provided in the substrate, each of the first groove 2 and the second groove 5 has a depth in a first direction X. The first groove 2 includes multiple first sub-grooves 20 arranged in the first direction X, the second groove 5 includes multiple second sub-grooves 50 arranged in the first direction X, and sidewalls of the first sub-grooves 20 and sidewalls of the second sub-grooves 50 are convex outwards. The WLs 32 protrude away from the first groove 2 and each are arranged at an interface of adjacent first sub-grooves 20 of the first sub-grooves. The first source-drain layers 61 are arranged on the sidewalls of the first sub-grooves 20. The second source-drain layers 62 protrude away from the second groove 5 and each arranged at an interface of adjacent second sub-grooves 50 of the second sub-grooves. Each of the second source-drain layers 62 and each of the WLs 32 are located between the first groove 2 and the second groove 5, and each of the second source-drain layers 62 is arranged opposite to a respective one of the WLs 32.

The semiconductor structure will be described in detail below.

First of all, it should be noted that a first direction X, a second direction Y and a third direction Z are present in the semiconductor structure and different from each other. Exemplarily, the first direction X is perpendicular to the second direction Y and the third direction Z, and the second direction Y is perpendicular to the third direction Z. In some embodiments, the semiconductor structure may be DRAM. The semiconductor structure further includes gate dielectric layers 31. Each of the gate dielectric layers 31 covers a side surface of a respective one of the WLs 32 away from interior of the first groove 2 and is also in contact with a respective one of the first source-drain layers 61 and a respective one of the second source-drain layers 62. That is, first source-drain layers 61, a second source-drain layer 62, a WL 32 and a gate dielectric layer 31 may constitute a transistor T (with reference to FIG. 44A).

The semiconductor structure further includes multiple capacitor plates 82 filling the first groove 2; the multiple capacitor plates 82 are arranged at intervals in a third direction Z and each extend in the first direction X, and the capacitor plates 82 are also filled in the first groove 2. The semiconductor structure further includes a dielectric layer 81 located on sidewalls of the first groove 2, for example, the dielectric layer 81 is located on opposite sidewalls of the first groove 2, and is also located between the first source-drain layer 61 and the capacitor plate 82. That is, the first source-drain layer 61, the dielectric layer 81 and the capacitor plate 82 constitute a capacitor. The capacitor and the transistor T may constitute a basic memory cell.

A reference is made to FIG. 44A, which shows a partially enlarged view of FIG. 27A. When a turn-on voltage is supplied to the WL 32, two channels are formed, that is, currents flow between the first source-drain layers 61 on upper and lower sides of the WL 32 and the second source-drain layer 62. When transistor T is turned on, the capacitor may store or release charges.

With continuous reference to FIG. 27B, the first groove 2 and the second groove 5 are arranged in the second direction Y and extend in the third direction Z. In some embodiments, there are multiple first grooves 2 and multiple second grooves 5, and the first grooves 2 and the second grooves 5 are alternately arranged in the second direction Y, so that it is beneficial to increasing the number of transistors T and capacitors, thereby improving memory capacity.

In some embodiments, with reference to FIG. 27A and FIG. 27B, multiple first source-drain layers 61 are arranged at intervals in the third direction Z; multiple second source-drain layers 62 are arranged at intervals in the third direction Z; and the WLs 32 each extend in the third direction Z. That is, multiple transistors may be arranged in the third direction Z, and the WL 32 may be used as a gate of each of multiple transistors arranged in the third direction Z. Furthermore, each of the first source-drain layers 61 and each of the second source-drain layers 62 may extend in the third direction Z, that is, each of the first source-drain layers 61 and each of the second source-drain layers 62 both may have a columnar structure in the third direction Z.

With continuous reference to FIG. 27A and FIG. 27B, the semiconductor structure further includes multiple BLs 64 filled in the second groove 5, arranged at intervals in the third direction Z and each extending in the first direction X; each of the BLs 64 is electrically connected to the second source-drain layers 62. That is, each of the BLs 64 is electrically connected to multiple second source-drain layers 62 arranged in the first direction X. The BLs 64 are electrically connected to peripheral circuits and read data stored in memory cells or write data into the memory cells.

Furthermore, the semiconductor structure further includes first isolation structures 41, the first isolation structures 41 extend in the second direction Y and are arranged in the third direction Z; each of the first isolation structures 41 spans the first groove 2 and the second groove 5. That is, the first isolation structures 41 isolate multiple transistors arranged in the third direction Z. However, the first isolation structures 41 do not truncate the WLs 32. Specifically, first source-drain layers 61 adjacent to each other arranged in the third direction Z are spaced by a respective one of the first isolation structure 41, and second source-drain layers 62 adjacent to each other arranged in the third direction Z are spaced by a respective one the first isolation structures 41. That is, the first isolation structure 41 is arranged between the first source-drain layers 61 adjacent to each other in the third direction Z, and the first isolation structure 41 is arranged between the second source-drain layers 62 adjacent to each other in the third direction Z. Furthermore, each of the first isolation structures 41 also isolates the BLs 64 adjacent to each other in the third direction Z and isolate the capacitor plates 82 adjacent to each other in the third direction Z.

It is worth noting that in the first example, the second groove 5 between adjacent first isolation structures 41 is in a continuous state. Therefore, opposite sides of the BL 64 in the third direction Z are also in contact with respective isolation structures of the first isolation structures 41, and opposite sides of the second source-drain layer 62 in the third direction Z are also in contact with respective isolation structures of the first isolation structures 41.

Figure 44C:
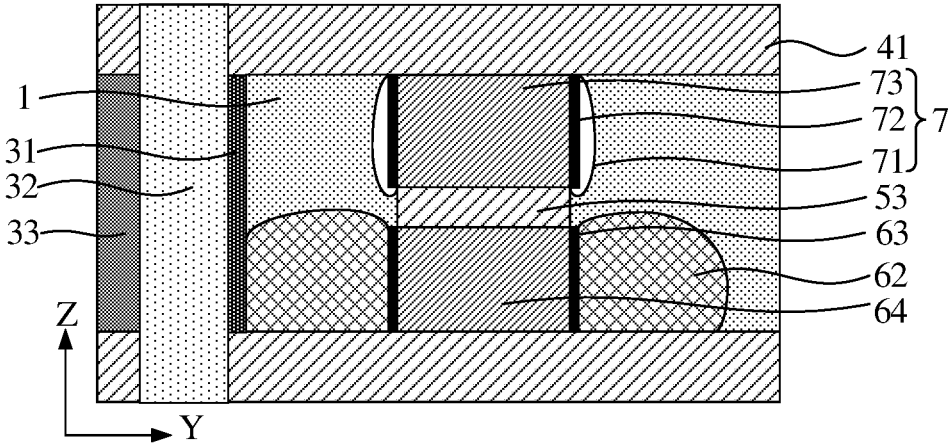
FIG. 44C is an enlarged view of a partial cross-section of a semiconductor structure.

In a second example, please refer to FIG. 43A to FIG. 43D and FIG. 44A to FIG. 44C. FIG. 44A is a partially enlarged view of FIG. 43A, FIG. 44B is a partially enlarged view of FIG. 43B, FIG. 44C is an enlarged view of a partial cross-section of a semiconductor structure, and the cross-section is perpendicular to the first direction X. The semiconductor structure includes a substrate 1, WLs 32, first source-drain layers 61, second source-drain layers 62. A first groove 2 and a second groove 5 are formed in the substrate, each of the first groove 2 and the second groove 5 has a depth in a first direction X, and the first groove 2 and the second groove 5 are arranged in a second direction Y, and each extend in a third direction Z. The second groove 5 includes BL grooves 541 and electrode grooves 542 spaced from each other in the third direction Z. The first groove 2 includes multiple first sub-grooves 20 arranged in the first direction X, each of the BL grooves 541 includes multiple sub-BL grooves 5410 arranged in the first direction X. The WLs 32 protrude away from the first groove 2 and each are arranged at an interface of adjacent first sub-grooves 20. The first source-drain layers 61 are arranged on the sidewalls of the first sub-grooves 20. The second source-drain layers 62 protrude away from the second groove 5 and each arranged at an interface of adjacent sub-BL grooves 5410. Each of the electrode grooves 542 is provided with an electrode layer 7 electrically connected to the substrate 1.

It may be known therefrom that the semiconductor structure shown in the first example is substantially the same as the semiconductor structure shown in the second example, and a main difference there-between lies in that the second grooves 5 of the two examples and internal structures thereof are different. The first grooves 2 of the two examples and internal structures thereof may be same. For example, structures of the two examples such as the WLs 32, the gate dielectric layers 31, the insulation layers 33, the first source-drain layers 61, the capacitor plates 82, the dielectric layers 81 or the like may be the same. The same or similar parts of the two examples may refer to detailed descriptions of the first example, and differences between the two examples will be described in detail below with reference to the drawings.

With reference to FIG. 43B, the electrode groove 542 includes multiple sub-electrode grooves 5420 arranged in the first direction X and protruding outwards. With reference to FIG. 43B and FIG. 44B, the electrode layer 7 includes a heavily doped layer 71 and a conductive layer 73 which are electrically connected, the heavily doped layer 71 is located in at least the substrate 1 located at an interface of adjacent sub-electrode grooves 5420, and the conductive layer 73 is filled in the electrode groove 542. In some other embodiments, the heavily doped layer 71 may also cover the entire sidewall of the electrode groove 542. Furthermore, the electrode layer 7 may also include a first metal silicide layer 72 located between the conductive layer 73 and the heavily doped layer 71.

In some embodiments, the semiconductor structure further includes second isolation structures 53 extending in the second direction Y. The first isolation structures 41 divide the second groove 5 into multiple BL electrode grooves 54 arranged in the third direction Z, and each of the second isolation structures 53 divide a respective one of the BL electrode grooves 54 into the BL groove 541 and the electrode groove 542. Therefore, isolation between the BL 64 and the electrode layer 7 may be achieved.

In the second example, since the semiconductor structure further includes the electrode layer 7 electrically connected to the substrate 1, the floating body effect may be avoided. Electrode layers 7 are arranged parallel to the BLs 64, and the electrode layers 7 and the BLs 64 are alternately arranged in the third direction Z and spaced by the second isolation structures 53.

It may be known by comparing the first example to the second example that the second groove 5 between adjacent first isolation structures 41 in the first example is in a continuous state, and the second groove 5 between adjacent first isolation structures 41 in the second example is divided by the second isolation structure 53. Therefore, in the first example, a length of the BL 64 in the third direction Z is equal to a length of the first source-drain layer 61 in the third direction Z and equal to a distance between adjacent first isolation structures 41. In the second example, a length of the BL 64 in the third direction Z is less than a length of the first source-drain layer 61 in the third direction Z and also less than a distance between adjacent first isolation structures 41.

In a third example, with reference to FIG. 43A to FIG. 44C and FIG. 45 to FIG. 52, the semiconductor structure includes an array region AR and peripheral regions P. The substrate 1 of the array region AR is provided with a transistor group T0 which includes multi-layer transistors T arranged in the first direction X; each of the transistors T includes a WL 32, a second source-drain layer 62 and two first source-drain layers 61, the WL 32 and the second source-drain layer 62 are arranged in a second direction Y, the two first source-drain layers 61 are arranged in the first direction X and located on opposite sides of the WL 32; two adjacent transistors T share one first source-drain layer 61 in the first direction X. The peripheral regions P are provided with sub-WL drivers SWD therein, the sub-WL drivers SWD are electrically connected to the WLs 32 and provide turn-on signals for two adjacent WLs 32 in the first direction X at different times.

That is, the first example and the second example show the array region AR of the semiconductor structure, and the third example further shows the peripheral regions P of the semiconductor structure and connection relationships of structures between the peripheral regions P and the array region AR based on the first example and the second example. The third example will be described in detail below with reference to the drawings.

Figure 45:
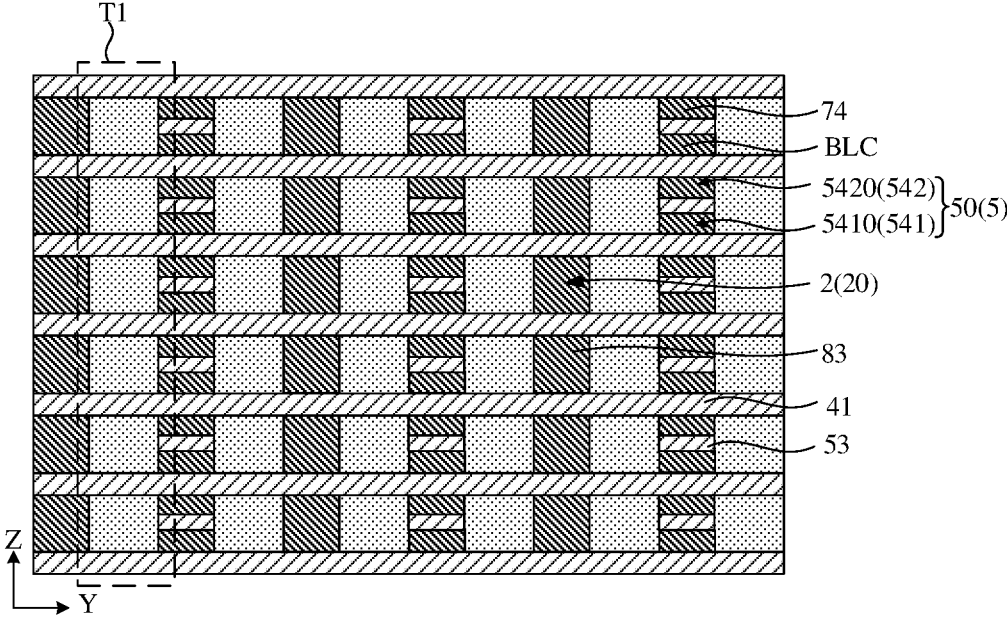
FIG. 45, FIG. 46, FIG. 48, FIG. 49, FIG. 51 and FIG. 52 show different top views of a semiconductor structure according to an embodiment of the disclosure in later-stage processes.

In some embodiments, with reference to FIG. 45, there are multiple the transistor group T0 (with reference to FIG. 43A), and the multiple transistor groups T0 are arranged as an array in the substrate 1. That is, the multiple transistor groups T0 are arranged in the second direction Y and also arranged in the third direction Z. In other words, multiple transistor groups T0 arranged in the third direction Z constitute a transistor unit T1, and multiple transistor units T1 are arranged in the second direction Y. Therefore, the number of transistor groups T0 may be increased, thereby improving memory capacity of the semiconductor structure. It should be noted that a dotted line box in FIG. 43D shows a position of an orthographic projection of a transistor unit T1 on the substrate 1.

With reference to FIG. 43A to FIG. 44C, the WLs 32 extend in the third direction Z, and one of the WLs 32 is shared by multiple transistors T on the same layer of the transistor unit T1. In some embodiments, the WLs 32 are arranged as an array in the substrate 1, that is, multiple WLs 32 are arranged in the first direction X and also arranged in the second direction Y. Furthermore, BLs 64 are filled in the second groove 5 and each of the BLs 64 is connected to multiple second source-drain layers 62 of the same transistor group T0.

A reference is made to FIG. 45, which shows a top view of a semiconductor structure in later-stage processes, and for a more intuitive illustration, only a part of structure is shown in FIG. 45. After early-stage processes are completed, a capacitor plug 83 is formed on an upper surface of the capacitor plate 82, a BL contact layer BLC is formed on an upper surface of the BL 64, and an electrode contact layer 74 is formed on an upper surface of the electrode layer 7. The capacitor plug 83, the BL contact layer BLC and the electrode contact layer 74 may extend in the first direction X. A dotted line box in FIG. 45 shows a position of an orthographic projection of a transistor unit T1 on the substrate 1. Connection structures and connection relationships between the array region AR and the peripheral areas P will be described in detail below.

Figure 46:
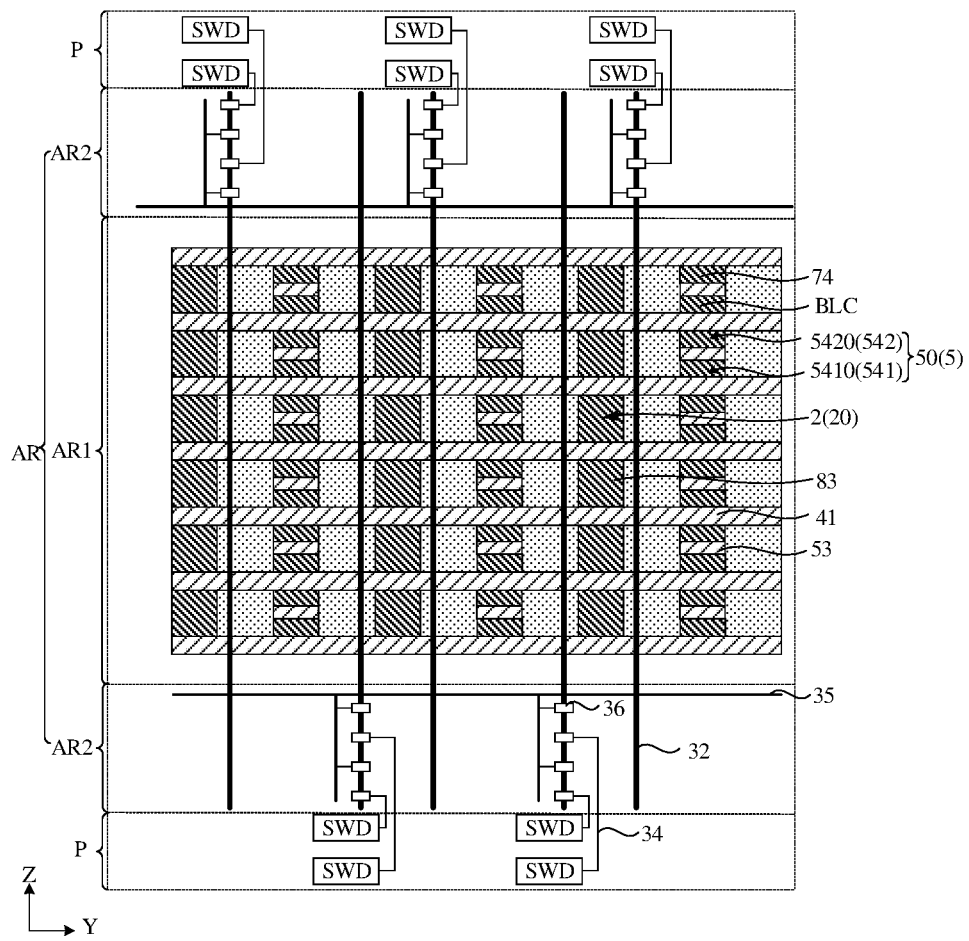

With reference to FIG. 46, sub-WL drivers SWD are arranged in each of the peripheral regions P and each electrically connected to a respective one of the WLs 32 to supply turn-on or turn-off signals to the respective one of the WLs 32. Connection relationships between the sub-WL drivers SWD and the WLs 32 are as follows.

Figure 47:
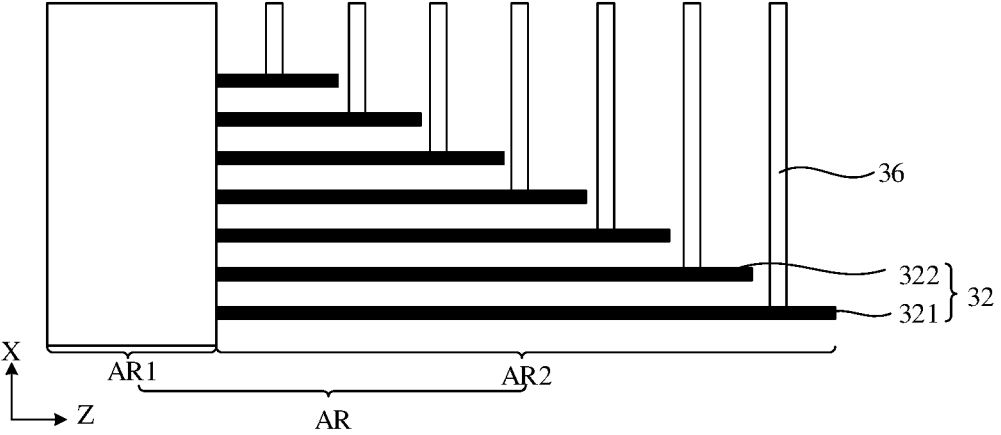
FIG. 47 shows a schematic diagram of a step region in a semiconductor structure according to yet another embodiment of the disclosure.

With reference to FIG. 46 and FIG. 47, the sub-WL drivers SWD may be electrically connected to the WLs 32 through lead pillars 36. Specifically, the array region AR includes a storage region AR1 and a step region AR2, the step region AR2 and the storage region AR1 are arranged in the third direction Z. The WLs 32 extend from the storage region AR1 into the step region AR2, and lengths of multiple WLs 32 increase sequentially in a direction pointing from an upper surface of the substrate 1 to a lower surface of the substrate 1, that is, the closer to the bottom layer, the longer the WL 32. The step region AR2 is provided with multiple lead pillars 36, which extend in the first direction X, are connected to multiple WLs 32 in one-to-one correspondence, and each are electrically connected to a respective one of the sub-WL drivers SWD. That is, by way of layer-wise etching, orthographic projections of different layer of WLs 32 on the substrate 1 are staggered and the WLs are connected through the lead pillars 36.

In some embodiments, with reference to FIG. 46, there are two step regions AR2, and the two step regions AR2 are arranged in the third direction Z and located on opposite sides of the storage region AR1. Therefore, more sufficient space positions may be provided for the lead pillars 36, thereby increasing distances between multiple lead pillars 36 to reduce parasitic capacitance between adjacent lead pillars 36.

In some embodiments, multiple sub-WL drivers SWD are located on opposite sides of the array region AR in the third direction Z respectively. That is, multiple sub-WL drivers SWD are arranged opposite to the step region AR2 respectively, so that distances between the multiple sub-WL drivers SWD and the step region AR2 may be reduced, therefore it is beneficial to reducing wiring length and wiring resistance. Furthermore, since the multiple sub-WL drivers SWD need to occupy large area on the substrate 1, and the lead pillars 36 are layer-wise arranged in the step regions AR2, it is beneficial to providing more sufficient space positions for the multiple sub-WL drivers SWD.

In some embodiments, with reference to FIG. 46, multiple WLs 32 of the same transistor unit T1 may extend from a same side of the array region AR into a same step region AR2, and the lead pillars 36 connected to the WLs 32 of the same transistor unit T1 are located on the same side of the array region AR. Therefore, multiple sub-WL drivers SWD electrically connected to the same transistor unit T1 may be located on the same side of the array region AR, so that it facilitates electrical connections of the multiple sub-WL drivers SWD to the lead pillars 36, therefore it is beneficial to reducing wiring length and wiring resistance.

Furthermore, the WLs 32 of adjacent transistor units T1 may extend from two sides of the array region AR into two step regions AR2 respectively. Such alternate arrangement is beneficial to improving uniformity of the structure and may also increase spacing between multiple lead pillars 36, thereby reducing parasitic capacitance. Furthermore, multiple sub-WL drivers SWD electrically connected to adjacent transistor units T1 are located on two different sides of the array region AR respectively, so that multiple sub-WL drivers SWD are evenly distributed in the peripheral regions P, and more sufficient space positions may also be provided for the sub-WL drivers SWD, and space waste may be reduced.

It should be noted that since upper and lower transistors T share a first source-drain layer 61, and thus upper and lower adjacent transistors T may be turned on at different times, to prevent reading and writing errors. That is, the sub-WL drivers SWD will not provide turn-on signals for two adjacent WLs 32 in the first direction X at a same time.

In some embodiments, the transistors T include isolation transistors and active transistors alternately arranged in the first direction X. A normally closed voltage is provided to the isolation transistor, so that the isolation transistor isolates two active transistors. In other words, an isolation transistor is arranged between two active transistors, thereby increasing a distance between the active transistors, and the isolation transistor is in a normally closed state, thereby playing a role of isolating the two active transistors and avoiding mutual interference between two adjacent active transistors.

In some embodiments, with reference to FIG. 46 and FIG. 47, the WL 32 of the active transistor is a first WL 321 and the WL 32 of the isolation transistor is a second WL 322. That is, the WLs 32 include first WLs 321 and second WLs 322 alternately arranged in the first direction X, multiple first WLs 321 are electrically connected to different sub-WL drivers SWD respectively, and multiple second WLs 322 are connected to a same normally closed signal source. Specifically, multiple first WLs 321 are connected to different sub-WL drivers SWD through first wires 34 respectively. Multiple second WLs 322 may be connected together through a second wire 35 to which a normally closed signal source applies a normally closed signal. In some embodiments, the second wire 35 may be directly connected to the normally closed signal source. In some other embodiments, the second wire 35 may be connected to a sub-WL driver SWD which provides the normally closed signal. Therefore, the number of sub-WL drivers SWD may be reduced, thereby reducing volume of the semiconductor structure.

It should be noted that the first wire 34 and the second wire 35 may be connected to the lead pillar 36 from opposite sides, thereby avoiding intersection and reducing interference. Exemplarily, with reference to FIG. 46, the first wire 34 is connected to a right side of the lead pillar 36, and the second wire 35 is connected to a left side of the lead pillar 36.

In some other embodiments, different WLs 32 may also be electrically connected to different sub-WL drivers SWD, so that the active transistor and the isolation transistor may be switched with respect to each other according to signals provided by the sub-WL drivers SWD, and thus the transistors T may be used more flexibly.

Figure 48:
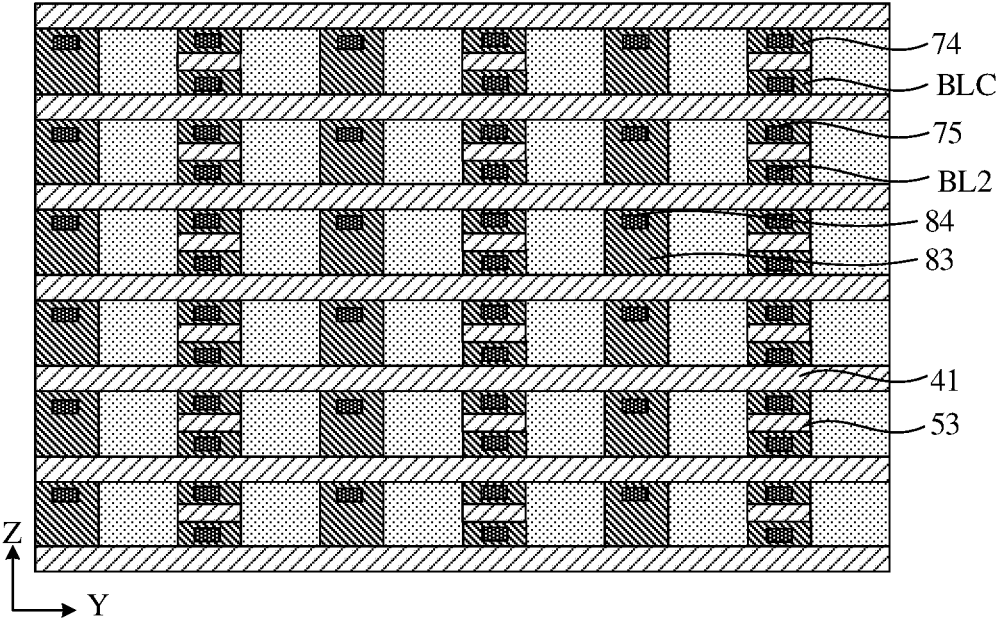
Figure 49:
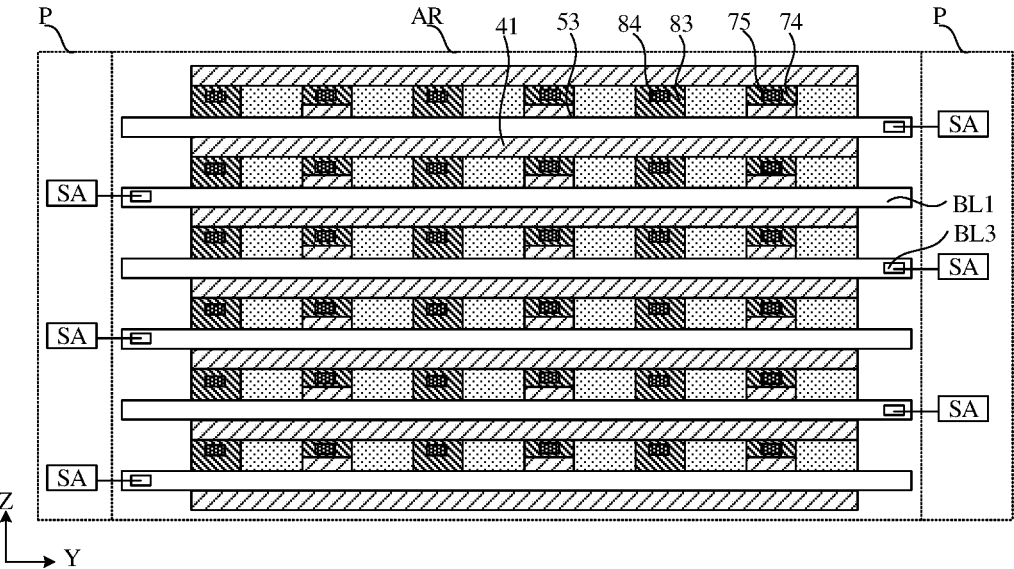
Figure 50:
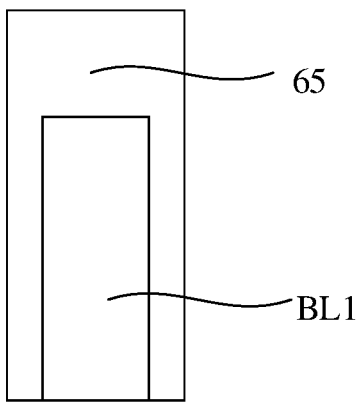
FIG. 50 shows a partial cross-sectional view of a bit line (BL) connection line in a semiconductor structure according to yet another embodiment of the disclosure.

With reference to FIG. 48 to FIG. 50, the peripheral region P is further provided with sense amplifiers SA therein, and the sense amplifiers SA are electrically connected to the BLs 64 to detect signals on the BLs 64 and amplify the signals on the BLs 64. Connection structures and connection relationships between the sense amplifiers SA and the BLs 64 are as follows.

With reference to FIG. 48, after the capacitor plug 83, the BL contact layer BLC and the electrode contact layer 74 are formed, the following are further included. A first contact layer 84 is formed on an upper surface of the capacitor plug 83, a second contact layer BL2 is formed on an upper surface of the BL contact layer BLC, and a third contact layer 75 is formed on an upper surface of the electrode contact layer 74. Except first contact layers 84, second contact layers BL2 and third contact layers 75 at edge positions, the remained first contact layers 84, second contact layers BL2 and third contact layers 75 at the middle position of the array region AR are shared by two adjacent transistor groups T0 arranged in the second direction Y. That is, the capacitor plate 82 is shared by transistor groups T0 on both sides of the capacitor plate 82, the BL 64 is shared by transistor groups T0 on both sides of the BL 64, and the electrode layer 7 is shared by transistor groups T0 on both sides of the electrode layer 7. Therefore, it is beneficial to improving area usage efficiency of the substrate 1.

In some embodiments, multiple first contact layers 84 and multiple third contact layers 75 are arranged on the same line in the second direction Y, and multiple second contact layers BL2 are arranged on another line in the second direction Y. Such arrangement may facilitate subsequent arrangement of connection lines.

With reference to FIG. 48 and FIG. 49, each of the sense amplifiers SA may be electrically connected to a respective one of the BLs 64 through a respective one of BL connection lines BL1.

Specifically, multiple BL connection lines BL1 extend in the second direction Y, and are arranged in the third direction Z; and each of the multiple BL connection lines BL1 is electrically connected to multiple BLs 64, that is, the BL connection line BL1 connects a row of second contact layers BL2 arranged in the second direction Y, thereby electrically connecting a row of BLs 64. Each of the BL connection lines BL1 is configured to intersect with the WL 32, and an intersection point of the BL connection line BL1 and the WL 32 may correspond to a transistor T.

In some embodiments, with reference to FIG. 49, multiple sense amplifiers SA are located on opposite sides of the array region AR arranged in the second direction Y respectively. Therefore, more sufficient space positions may be provided for the sense amplifiers SA. Furthermore, a fourth contact layer BL3 is arranged at an end of each of the BL connection lines BL1 and electrically connected to a respective one of the sense amplifiers SA. When multiple sense amplifiers SA are located on opposite sides of the array region AR respectively, multiple fourth contact layers BL3 are also located on opposite edges of the array region AR respectively, so that it is beneficial to increasing spacing between the fourth contact layers BL3, thereby reducing parasitic capacitance between the fourth contact layers BL3. In some other embodiments, multiple sense amplifiers SA may also be located on a same side of the array region AR.

Adjacent BL connection lines BL1 are connected to the sense amplifiers SA located on two different sides of the array region AR respectively. Therefore, arrangement of multiple sense amplifiers SA is more uniform and even, and production processes are simpler; furthermore, spacing between multiple fourth contact layers BL3 located on the same side is the same, which is beneficial to equalizing parasitic capacitance.

A reference is made to FIG. 50, in which it is a partial cross-sectional view of the BL connection line BL1, and the cross-section is perpendicular to the second direction Y. A fifth isolation film 65 is arranged at a top and a sidewall of the BL connection line BL1, to protect the BL connection line BL1 and isolate the BL connection line BL1 from the WL 32. A material of the fifth isolation film 65 may be silicon nitride or silicon oxide.

The peripheral region P is also provided with a bias signal source (not shown in the figures) therein, and the bias signal source is electrically connected to electrode layers 7, and provide bias signals to the electrode layers 7 to fix a potential of the substrate 1 and avoid accumulation of charges in the substrate 1. Connection structures and connection relationships between the electrode layers 7 and the bias signal source are as follows.

Figure 51:
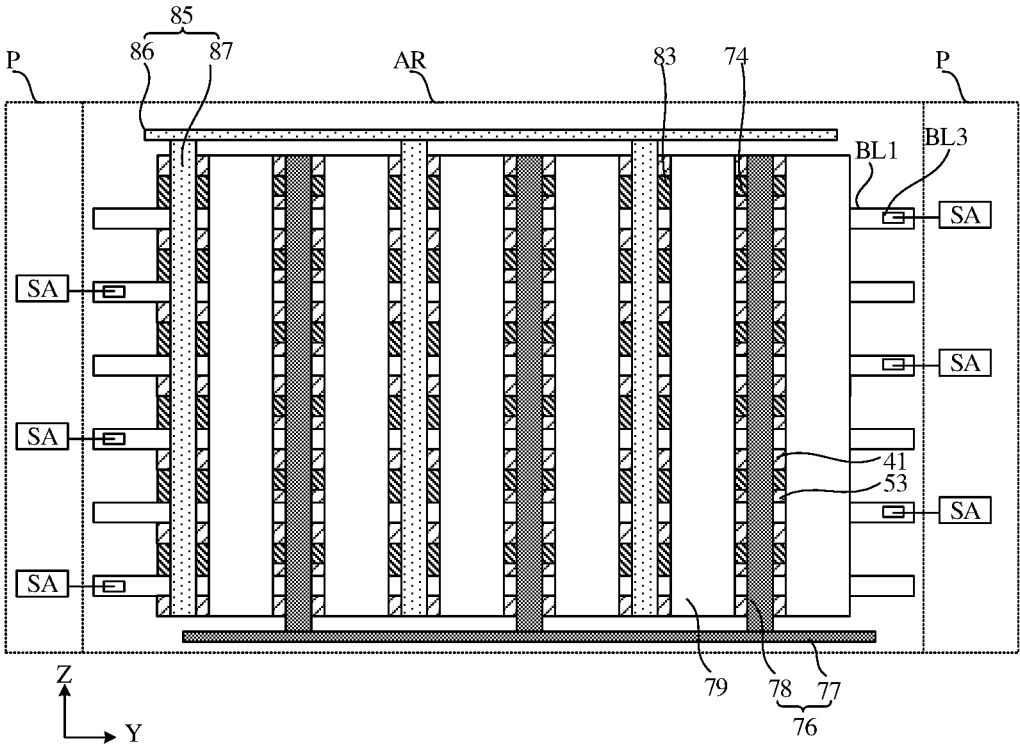

With reference to FIG. 51, in case that the second groove 5 includes BL grooves 541 and electrode grooves 542 spaced from each other in the third direction Z, and each of the electrode grooves 542 are provided with an electrode layer 7 electrically connected to the substrate 1, the semiconductor structure further includes an electrode connection line 76 electrically connected to multiple electrode layers 7 and electrically connected to a bias signal source. In some embodiments, the electrode connection line 76 includes a first electrode connection line 77 and multiple second electrode connection lines 78 which are connected with the first electrode connection line, the first electrode connection line 77 extends in the second direction Y, and the second electrode connection lines 78 extend in the third direction Z; each of the second electrode connection lines 78 is electrically connected to multiple electrode layers 7, that is, each of the second electrode connection lines 78 is connected to the third contact layers 75 (with reference to FIG. 49) and thus connected to the electrode layers 7. With the above connection, multiple electrode layers 7 may acquire the same bias voltage signal, so that it is beneficial to simplifying structures.

In some other embodiments, in case that the electrode layers 7 are not provided, it is unnecessary to provide the electrode connection line 76. The peripheral region P is also provided with a capacitor signal source (not shown in the figures) therein, and the capacitor plates 82 are electrically connected to the capacitor signal source. The capacitor signal source provides a capacitor signal to the capacitor plates 82, and connection structures and connection relationships between the capacitor plates 82 and the capacitor signal source are as follows.

With reference to FIG. 51, the semiconductor structure further includes a plate connection line 85 electrically connected to multiple capacitor plates 82 and electrically connected to a capacitor signal source. In some embodiments, the plate connection line 85 include a first plate connection line 86 and multiple second plate connection lines 87 which are connected with the first plate connection line, the first plate connection line 86 extends in the second direction Y, the second plate connection lines 87 extend in the third direction Z; the second plate connection lines 87 are electrically connected to multiple capacitor plates 82. With the above connection, multiple capacitor plates 82 may acquire the same capacitor signal, so that it is beneficial to simplifying structures. Exemplarily, the capacitor signal may be a ground voltage.

In some embodiments, the first plate connection line 86 and the first electrode connection line 77 are located on opposite sides of the array region AR respectively; the second plate connection lines 87 and the second electrode connection lines 78 are alternately arranged in the second direction Y. Therefore, arrangement of the plate connection line 85 and the electrode connection line 76 is simpler, and an intersection relationship between the plate connection line 85 and the electrode connection line 76 may be avoided, so that it is beneficial to reducing signal interference. Such arrangement is also beneficial to shortening lengths of the plate connection line 85 and the electrode connection line 76. Furthermore, the plate connection line 85 and the electrode connection line 76 may be arranged in the same layer, that is, the plate connection line 85 and the electrode connection line 76 may be formed by the same process step, so that it is beneficial to reducing production costs. Furthermore, a third isolation structure 79 may be arranged between the plate connection line 85 and the electrode connection line 76, and a material of the third isolation structure 79 may be silicon nitride.

Figure 52:
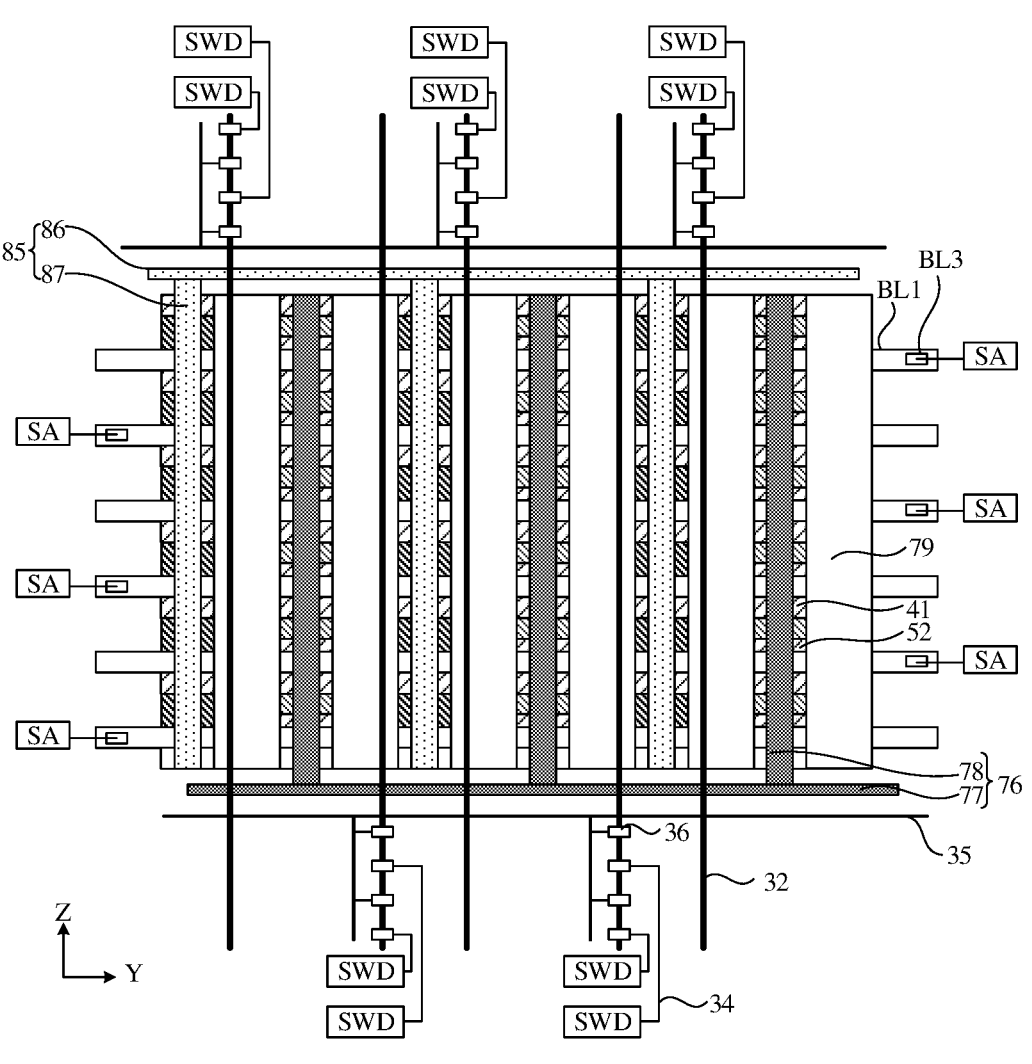

A reference is made to FIG. 52, showing a complete semiconductor structure. In summary, the semiconductor structure provided in the embodiments of the disclosure is provided with transistors T and capacitors which are 3D stacked and constitute memory cells. In the first direction X, adjacent memory cells may be turned on at different times, to avoid interference between the adjacent memory cells. That is, the WLs 32 include first WLs 321 and second WLs 322 alternately arranged in the first direction X, multiple first WLs 321 may be electrically connected to different sub-WL drivers SWD, and signals on the second WLs 322 may be normally closed signals. In the third direction Z, adjacent memory cells are spaced by the first isolation structure 41. Furthermore, the BLs 64 are electrically connected together through the BL connection line BL1 and connected to the sense amplifier SA. All electrode layers 7 may be electrically connected together, and all capacitor plates 82 may be electrically connected together. The forgoing layouts are beneficial to reducing signal interference and avoid space waste, so that it is beneficial to improving performance of the semiconductor structure.

The invention claimed is:

1. A semiconductor structure, comprising:
a substrate, a first groove and a second groove being provided in the substrate, each of the first groove and the second groove having a depth in a first direction, the first groove comprising a plurality of first sub-grooves arranged in the first direction, the second groove comprising a plurality of second sub-grooves arranged in the first direction, and sidewalls of the first sub-grooves and sidewalls of the second sub-grooves being convex outwards;
word lines protruding away from the first groove, and each arranged at an interface of adjacent first sub-grooves of the first sub-grooves;
first source-drain layers, arranged on the sidewalls of the first sub-grooves; and
second source-drain layers protruding away from the second groove, and each arranged at an interface of adjacent second sub-grooves of the second sub-grooves, each of the second source-drain layers being located between the first groove and the second groove, each of the word lines being located between the first groove and the second groove, and each of the second source-drain layers being arranged opposite to a respective one of the word lines.

2. The semiconductor structure of claim 1, further comprising gate dielectric layers each of the gate dielectric layers covering a side surface of a respective one of the word lines away from interior of the first groove and in contact with a respective one of the first source-drain layers and a respective one of the second source-drain layers.

3. The semiconductor structure of claim 1, further comprising:
a plurality of capacitor plates, filling the first groove, arranged at intervals in a third direction and extending in the first direction, the third direction being perpendicular to the first direction; and
a dielectric layer, arranged on a sidewall of the first groove, and arranged between the first source-drain layers and the capacitor plates.

4. The semiconductor structure of claim 1, further comprising: a plurality of bit lines, filled in the second groove, arranged at intervals in a third direction and extending in the first direction, the third direction being perpendicular to the first direction, and each of the bit lines electrically connected to the second source-drain layers, wherein the word lines extend in the third direction,
the semiconductor structure comprises a plurality of first source-drain layers arranged at intervals in the third direction, and a plurality of second source-drain layers arranged at intervals in the third direction.

5. The semiconductor structure of claim 4, wherein a length of each of the bit lines in the third direction is equal to a length of each of the first source-drain layers in the third direction.

6. The semiconductor structure of claim 4, wherein the second groove comprises bit line grooves and electrode grooves spaced from each other in the third direction, the first groove comprises a plurality of first sub-grooves arranged in the first direction, each of the bit line grooves comprises a plurality of sub-bit line grooves arranged in the first direction, each of the electrode grooves comprises a plurality of sub-electrode grooves arranged in the first direction, sidewalls of the sub-bit line grooves and sidewalls of the sub-electrode grooves are convex outwards, and the second sub-groove comprises the sub-electrode groove and the sub-bit line groove,
the bit lines are filled in the bit line grooves,
each of the second source-drain layers is located at an interface of adjacent sub-bit line grooves of the sub-bit line grooves,
each of the electrode grooves is provided with an electrode layer electrically connected to the substrate.

7. The semiconductor structure of claim 6, wherein the electrode layer comprises a first metal silicide layer, a heavily doped layer and a conductive layer which are electrically connected, the heavily doped layer is located in at least the substrate located at an interface of adjacent sub-electrode grooves of the sub-electrode grooves, the conductive layer is filled in a respective one of the electrode grooves, and the first metal silicide layer is located between the conductive layer and the heavily doped layer.

8. The semiconductor structure of claim 1, comprising:
an array region, the substrate in the array region being provided with a transistor group which comprises a plurality of layers of transistors arranged in the first direction, each of the transistors comprising one of the word lines, one of the second source-drain layers and two of the first source-drain layers, the one of the word lines and the one of the second source-drain layers being arranged in a second direction, the two of the first source-drain layers being arranged in the first direction and located on opposite sides of the one of the word lines, and two adjacent transistors of the transistors sharing one of the first source-drain layers in the first direction; and
peripheral regions, provided with sub-word line drivers, the sub-word line drivers being electrically connected to the word lines and providing turn-on signals for two adjacent word lines of the word lines in the first direction at different times.

9. The semiconductor structure of claim 8, wherein the word lines comprise first word lines and second word lines alternately arranged in the first direction, the first word lines being electrically connected to different sub-word line drivers respectively, and the second word lines being connected to a same normally closed signal source.

10. The semiconductor structure of claim 8, wherein there are a plurality of transistor groups, the plurality of transistor groups arranged in a third direction constitute a transistor unit, a plurality of transistor units are arranged in the second direction, the third direction is perpendicular to the second direction, and each of the second direction and the third direction is perpendicular to the first direction, the word lines extend in the third direction, and one of the word lines is shared by the transistors on a same layer of the transistor unit.

11. The semiconductor structure of claim 10, wherein the sub-word line drivers are located on opposite sides of the array region arranged in the third direction, some of the sub-word line drivers electrically connected to a same transistor unit are located on a same side of the array region, and some of the sub-word line drivers electrically connected to adjacent transistor units are located on different sides of the array region.

12. The semiconductor structure of claim 11, wherein the array region comprises a storage region and two step regions, the two step regions being arranged in the third direction and located on opposite sides of the storage region, the word lines extend from the storage region into the step regions, and lengths of the word lines increase sequentially in a direction pointing from an upper surface of the substrate to a lower surface of the substrate, the step region is provided with a plurality of lead pillars which extend in the first direction, the lead pillars being connected to the word lines in one-to-one correspondence, and being electrically connected to the sub-word line drivers.

13. The semiconductor structure of claim 8, wherein there are a plurality of transistor groups arranged as an array in the substrate, the semiconductor structure further comprises: bit lines filled in the second groove, each of the bit lines being connected to a plurality of second source-drain layers of a same transistor group of the transistor groups; and a plurality of bit line connection lines, extending in the second direction, and arranged in a third direction; each of the bit line connection lines being electrically connected to bit lines, the peripheral regions are further provided with sense amplifiers, and each of the bit line connection lines is electrically connected to a respective one of the sense amplifiers.

14. The semiconductor structure of claim 13, wherein the sense amplifiers are located on opposite sides of the array region in the second direction respectively, adjacent bit line connection lines of the bit line connection lines are connected to respective sense amplifiers of the sense amplifiers located on two different sides of the array region respectively.

15. The semiconductor structure of claim 8, wherein the second groove comprises bit line grooves and electrode grooves spaced in a third direction, each of the electrode grooves is provided with an electrode layer electrically connected to the substrate, the semiconductor structure further comprises: an electrode connection line, electrically connected to a plurality of the electrode layers and electrically connected to a bias signal source.

16. The semiconductor structure of claim 15, further comprising:

a dielectric layer, located on opposite sidewalls of the first groove;

a capacitor plate, filled in the first groove, the dielectric layer being located between the first source-drain layers and the capacitor plate; and a plate connection line, electrically connected to a plurality of the capacitor plates and electrically connected to a capacitor signal source.

17. The semiconductor structure of claim 16, wherein the plate connection line comprises a first plate connection line and a plurality of second plate connection lines which are connected with the first plate connection line, the first plate connection line extends in the second direction, the second plate connection lines extend in the third direction, and the second plate connection lines are electrically connected to the plurality of the capacitor plates, the electrode connection line comprises a first electrode connection line and a plurality of second electrode connection lines which are connected with the first electrode connection line, the first electrode connection line extends in the second direction, the second electrode connection lines extend in the third direction, and the second electrode connection lines are electrically connected to a plurality of the electrode layers, the first plate connection line and the first electrode connection line are located on opposite sides of the array region respectively, and the second plate connection lines and the second electrode connection lines are alternately arranged in the second direction.

* * * * *